United States Patent
Kim et al.

(10) Patent No.: US 9,557,655 B2
(45) Date of Patent: Jan. 31, 2017

(54) PHOTOMASK INCLUDING FOCUS METROLOGY MARK, SUBSTRATE TARGET INCLUDING FOCUS MONITOR PATTERN, METROLOGY METHOD FOR LITHOGRAPHY PROCESS, AND METHOD OF MANUFACTURING INTEGRATED CIRCUIT DEVICE

(71) Applicants: Ji-myung Kim, Hwaseong-si (KR); Yong-chul Kim, Daejoen (KR); Young-sik Park, Seoul (KR); Kwang-sub Yoon, Yongin-si (KR)

(72) Inventors: Ji-myung Kim, Hwaseong-si (KR); Yong-chul Kim, Daejoen (KR); Young-sik Park, Seoul (KR); Kwang-sub Yoon, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/700,864

(22) Filed: Apr. 30, 2015

(65) Prior Publication Data

US 2016/0033880 A1 Feb. 4, 2016

(30) Foreign Application Priority Data

Jul. 29, 2014 (KR) .................... 10-2014-0096766

(51) Int. Cl.
*H01L 21/66* (2006.01)
*G03F 7/20* (2006.01)
(Continued)

(52) U.S. Cl.
CPC ............. *G03F 7/70641* (2013.01); *G03F 1/38* (2013.01); *H01L 21/027* (2013.01); *H01L 21/0274* (2013.01)

(58) Field of Classification Search
CPC .................... H01L 21/027; H01L 21/0274
See application file for complete search history.

(56) References Cited

U.S. PATENT DOCUMENTS

| | | | |
|---|---|---|---|
| 5,300,786 A | 4/1994 | Brunner et al. | |
| 6,171,739 B1 | 1/2001 | Spence et al. | |
| (Continued) | | | |

FOREIGN PATENT DOCUMENTS

| | | |
|---|---|---|
| JP | 06-148413 | 5/1994 |
| JP | 2010-261999 | 11/2010 |
| KR | 1020100085595 | 7/2010 |

OTHER PUBLICATIONS

Conover, B., Soft Electronics: Organic Electronics & LCDs, Lecture 3, Date unknown but believed to be prior to the filing date of the present application, 22 pages, retrieved from the internet at URL: http://www.ece.ncsu.edu/oleg/fileswiki/d/d1/leco3_blc_polarization_birefringence+fresnel.pdf.
(Continued)

*Primary Examiner* — Cuong Q Nguyen
(74) *Attorney, Agent, or Firm* — Myers Bigel, P.A.

(57) ABSTRACT

A photomask includes a focus metrology mark region that includes a plurality of focus monitor patterns. To measure a focal variation of a feature pattern formed on a substrate, a substrate target for lithography metrology including a focus metrology mark formed on the same level as the feature pattern is used. A lithography metrology apparatus includes a projection device including a polarizer; a detection device detecting the powers of ±n-order diffracted light beams from among output beams diffracted by the focus metrology mark of a to-be-measured substrate; and a determination device which determines, from a power deviation between the ±n-order diffracted light beams, defocus experienced by the feature pattern.

20 Claims, 30 Drawing Sheets

(51) Int. Cl.
   *H01L 21/027* (2006.01)
   *G03F 1/38* (2012.01)

(56) References Cited

U.S. PATENT DOCUMENTS

| | | | |
|---|---|---|---|
| 6,395,432 | B1 | 5/2002 | Rolfson |
| 6,537,837 | B2 | 3/2003 | Lee |
| 6,710,853 | B1 | 3/2004 | La Fontaine et al. |
| 6,811,939 | B2 | 11/2004 | Nakao et al. |
| 7,033,708 | B2 | 4/2006 | Tejnil |
| 7,344,824 | B2 | 3/2008 | Progler |
| 7,678,513 | B2 | 3/2010 | Nomura |
| 7,846,625 | B2 | 12/2010 | Kawashima |
| 7,855,037 | B2 | 12/2010 | Kim |
| 7,867,692 | B2 | 1/2011 | Amako |
| 8,830,585 | B2 | 9/2014 | Hirai et al. |
| 2002/0100012 | A1* | 7/2002 | Sutani ............. G03F 7/70641 716/53 |
| 2006/0115746 | A1 | 6/2006 | Choi et al. |
| 2011/0059402 | A1 | 3/2011 | Azuma et al. |
| 2011/0116705 | A1 | 5/2011 | Heo et al. |
| 2013/0314784 | A1 | 11/2013 | Fattal et al. |
| 2016/0225610 | A1* | 8/2016 | Chien ............. H01L 21/0274 |

OTHER PUBLICATIONS

Ellipsometry, From Wikipedia the Free Encyclopedia, 8 pages, Date unknown but believed to be prior to the filing date of the present application, retrieved from the internet at URL: http://en.wikipedia.org/wiki/ellipsometry.

J.A. Woollam Co. Inc., Ellipsometry Measurements, 2015, 2 pages, retrieved from the Internet at URL: http://www.jawoollam.com/tutorial_4.html.

Manset, N., Polarization of Light: from Basics to Instruments, 84 pages, Date unknown but believed to be prior to the filing date of the present application, retrieved from the internet at URL http://www.cfht.hawaii.edu/~manset/polarizationlightintro.ppt.

Meadowlark Optics, 12 pages, Date unknown but believed to be prior to the filing date of the present application, retrieved from the internet at URL: http://fp.optics.arizona.edu/opti471b/reading/lab11/meadowlark_retarders_principles.pdf.

Piel J., Introduction to ellipsometry, EPFL Oct. 7, 2008, 57 pages, retrieved from the internet at URL: http://cmi.epfl.ch/metrology/files/sopra%20ges%205e/introduction%20to%20ellipsometry.pdf.

Szilagyi, A. Electromagnetic waves and circular dichroism: an animated tutorial, Jan. 30, 2002, 41 pages retrieved from the internet at URL: http://www.enzim.hu/~szia/cddemo/edemo0.htm.

Waveplate, From Wikipedia the Free Encyclopedia, 5 pages, Date unknown but believed to be prior to the filing date of the present application, retrieved from the internet at URL: http://en.wikipedia.org/wiki/waveplate.

Brunner, T.A., et al., "Quantitative stepper metrology using the focus monitor test mask", SPIE vol. 2197, May 17, 1994, pp. 541-549.

Higashibata, S., et al., Improvement of focus accuracy on processed wafer, Proc. of SPIE vol. 8681, 2013, 7 pages.

Richter, I. et al., "Design considerations of form birefringement microstructures", Applied Optics, vol. 34, No. 14, May 10, 1995, pp. 2421-2429.

Nomura, H., "New phase shift gratings for measuring aberrations", Proceedings of SPIE vol. 4346, 2001, pp. 25-35.

La Fontaine, B., et al., "Analysis of Focus Errors in Lithography using Phase-Shift Monitors", Proceedings of SPIE, vol. 4691, 2002, pp. 315-324.

\* cited by examiner

PHOTOMASK INCLUDING FOCUS METROLOGY MARK, SUBSTRATE TARGET INCLUDING FOCUS MONITOR PATTERN, METROLOGY METHOD FOR LITHOGRAPHY PROCESS, AND METHOD OF MANUFACTURING INTEGRATED CIRCUIT DEVICE

CROSS-REFERENCE TO RELATED APPLICATIONS

This application claims the benefit of and priority from Korean Patent Application No. 10-2014-0096766, filed on Jul. 29, 2014, in the Korean Intellectual Property Office, the disclosure of which is incorporated herein in its entirety by reference.

BACKGROUND

The inventive concepts relate to metrology of lithography, and more particularly, to a photomask including a focus metrology mark that is used in measuring variations in lithography, a substrate target including a focus monitor pattern, a lithography metrology method, and a method of manufacturing an integrated circuit (IC) device.

With increasing integration densities of semiconductor devices, various lithography techniques for forming fine patterns are being developed. Various metrology techniques have also been proposed to monitor a lithographic process for manufacturing highly-integrated devices. As integration densities of semiconductor devices increase, a critical dimension (CD) of a photoresist pattern typically decreases. Accordingly, to improve the CD uniformity of the photoresist pattern having a minute CD, a lithographic process may need to be precisely and reliably monitored.

SUMMARY

The inventive concepts provide a photomask capable of being used in precise in-line monitoring of minute focal variations that accompany a lithographic process performed to manufacture an integrated circuit (IC) device, and a substrate target for lithography metrology.

The inventive concepts also provide a lithography metrology method and a lithography metrology apparatus capable of precise and non-destructive in-line monitoring of minute focal variations that accompany a lithographic process performed to manufacture an IC device, without adding a separate process to a process of manufacturing the IC device.

The inventive concepts also provide a method of manufacturing an IC device, in which the critical dimension (CD) uniformity of patterns necessary for manufacturing an IC device may be improved and a reliable IC device may be manufactured, by using a lithography metrology method capable of precise and non-destructive in-line monitoring of minute focal variations that accompany a lithographic process performed to manufacture an IC device.

According to some embodiments of the inventive concepts, in a lithography metrology method, characteristics of respective light beams having a same non-zero diffraction order, as diffracted by a focus metrology mark comprising reference and shift photoresist patterns adjacent one another on a substrate, are analyzed. A focal variation in an exposure process that was used to form the reference and shift photoresist patterns of the focus metrology mark is identified based on comparison of the characteristics of the respective light beams having the same non-zero diffraction order.

In some embodiments, in identifying the focal variation, a relative distance between the reference and shift photoresist patterns of the focus metrology mark may be determined based on the comparison of the characteristics of the respective light beams having the same non-zero diffraction order as diffracted thereby. The relative distance between the reference and shift photoresist patterns of the focus metrology mark may be proportional to the focal variation.

In some embodiments, the characteristics may be respective power levels of the respective light beams having the same non-zero diffraction order diffracted by the focus metrology mark. A difference between the respective power levels may be proportional to the relative distance between the reference and shift photoresist patterns of the focus metrology mark.

In some embodiments, the focus metrology mark on the substrate may be irradiated with an incident light beam, and the respective power levels of the respective light beams having the same non-zero diffraction order, as diffracted by the focus metrology mark responsive to the incident light beam, may be measured. A defocus experienced by photoresist feature patterns on a same level of the substrate as the focus metrology mark during the exposure process may be determined based on the relative distance between the reference and shift photoresist patterns of the focus metrology mark.

In some embodiments, the substrate may further include a diffraction-based overlay key thereon adjacent the focus metrology mark and within an area illuminated by the incident light beam. Respective power levels of light beams having a same non-zero diffraction order diffracted by the diffraction-based overlay key responsive to the incident light beam may be measured. An overlay error with respect to the photoresist feature patterns may be determined based on a difference between the respective power levels of the light beams diffracted by the diffraction-based overlay key.

In some embodiments, a region of the substrate including the focus metrology mark may be free of the photoresist feature patterns.

In some embodiments, a photomask including a main pattern region and focus metrology mark region may be provided. The focus metrology mark region may include a reference section that does not substantially affect a phase of light passing therethrough, and an adjacent phase shift section that is configured to alter a phase of light passing therethrough. A photoresist layer on the substrate may be exposed using the photomask including the focus metrology mark region having the reference and phase shift sections to define the focus metrology mark comprising the reference and shift photoresist patterns, respectively.

In some embodiments, a width of a light-transmissive region of the reference section may be greater than a width of a light-transmissive region of the phase shift section adjacent thereto.

In some embodiments, a ratio of the width of the light-transmissive regions of the reference section to the phase shift section may correspond to a range over which the difference between the respective power levels of the respective light beams is linearly proportional to the relative distance between the reference and shift photoresist patterns of the focus metrology mark.

In some embodiments, the reference and phase shift sections of the photomask may be defined by portions of a same transmissive substrate. The respective thicknesses of the transmissive substrate in the light-transmissive regions of the reference and phase shift sections may differ.

In some embodiments, a set of focal values used in the exposure process may be corrected responsive to identifying the focal variation. For example, the focal variation may be a defocus experienced by the substrate during the exposure process, and the set of focal values may be corrected by determining that the defocus is outside of a depth of focus (DOF) tolerance value, calculating compensated focus data based on the defocus responsive to the determining, and updating the set of focal values with the compensated focus data.

According to an aspect of the inventive concepts, there is provided a photomask comprising: a main pattern region on which a main pattern for forming an integrated circuit (IC) in a chip region on a wafer is formed; and a focus metrology mark region comprising a plurality of focus monitor patterns formed apart from the main pattern. The focus metrology mark region comprises a transparent substrate; at least one reference section comprising a reference light-transmissive region that does not change the phase of light passing through the transparent substrate, and a reference light-shield pattern that covers the transparent substrate to define the reference light-transmissive region; and at least one phase shift section comprising a shift light-transmissive region that causes a phase shift of an angle other than 180° to occur with respect to the light passing through the transparent substrate, and a shift light-shield pattern that covers the transparent substrate to define the shift light-transmissive region. The at least one reference section and the at least one phase shift section are arranged in a line along a first direction.

A thickness of the shift light-transmissive region on the transparent substrate may be different from a thickness of the reference light-transmissive region on the transparent substrate.

In some embodiments, the shift light-transmissive region may comprise a first light-transmissive portion having a thickness that is equal to a thickness of the reference light-transmissive region; and a second light-transmissive portion having a thickness that is different from the thickness of the reference light-transmissive region.

In some embodiments, a width of the reference light-transmissive region in the first direction may be equal to a width of the shift light-transmissive region in the first direction. In other embodiments, a width of the reference light-transmissive region in the first direction may be different from a width of the shift light-transmissive region in the first direction. In an example, a ratio between a width of the reference light-shield pattern in the first direction and a width of the reference light-transmissive region in the first direction may be 1:1. In another example, a ratio between a width of the shift light-shield pattern in the first direction and a width of the shift light-transmissive region in the first direction may be 1:1.

The focus metrology mark region may include a plurality of reference sections and a plurality of phase shift sections. The plurality of reference sections and the plurality of phase shift sections may alternate with each other in the first direction.

In an example, each of the plurality of reference sections may be a reference section of one cycle including a single reference light-shield pattern and a single reference light-transmissive region arranged in the first direction. Each of the plurality of phase shift sections may be a phase shift section of one cycle including a single shift light-shield pattern and a single shift light-transmissive region arranged in the first direction.

In another example, each of the plurality of reference sections may be a reference section of a plurality of cycles including a plurality of reference light-shield patterns and a plurality of reference light-transmissive regions arranged in the first direction, and each of the plurality of phase shift sections may be a phase shift section of one cycle including a single shift light-shield pattern and a single shift light-transmissive region arranged in the first direction.

In another example, each of the plurality of reference sections may be a reference section of one cycle including a single reference light-shield pattern and a single reference light-transmissive region arranged in the first direction, and each of the plurality of phase shift sections may be a phase shift section of a plurality of cycles including a plurality of shift light-shield patterns and a plurality of shift light-transmissive regions arranged in the first direction.

In another example, each of the plurality of reference sections may be a reference section of a plurality of cycles including a plurality of reference light-shield patterns and a plurality of reference light-transmissive regions arranged in the first direction, and each of the plurality of phase shift sections may be a phase shift section of a plurality of cycles including a plurality of shift light-shield patterns and a plurality of shift light-transmissive regions arranged in the first direction.

According to another aspect of the inventive concepts, there is provided a substrate target for lithography metrology comprising a substrate; a feature pattern formed on the substrate; and a focus metrology mark formed on a same level as a level on which the feature pattern is formed on the substrate, the focus metrology mark comprising a plurality of metrology patterns spaced apart from each other to measure a focal variation of the feature pattern.

The plurality of metrology patterns may comprise a plurality of reference pattern groups spaced apart from each other at regular intervals in a first direction; and a plurality of shift pattern groups that alternate with the plurality of reference pattern groups and are aligned with the plurality of reference pattern groups in a straight line in the first direction. Each of the plurality of reference pattern groups may comprise at least one reference pattern, and each of the plurality of shift pattern groups may comprise at least one shift pattern.

A distance in the first direction between the at least one reference pattern and the at least one shift pattern may depend on defocus during an exposure process for forming the at least one shift pattern.

A minimum distance between a reference pattern group selected from the plurality of reference pattern groups and a shift pattern group adjacent to the selected reference pattern group from among the plurality of shift pattern groups may vary in the first direction.

According to another aspect of the inventive concepts, there is provided a lithography metrology apparatus comprising a stage configured to support a to-be-measured substrate, the to-be-measured substrate comprising a substrate, a feature pattern formed on the substrate, and a focus metrology mark formed on a same level as a level on which the feature pattern is formed on the substrate, the focus metrology mark comprising a plurality of metrology patterns spaced apart from each other to measure a focal variation of the feature pattern; an illumination device configured to generate a radiation beam; a projection device comprising a polarizer configured to polarize the radiation beam generated by the illumination device such that the radiation beam may be incident on the focus metrology mark of the to-be-measured substrate; a detection device comprising a first detection unit configured to detect powers of ±n-order diffracted light beams diffracted at identical angles so as to be symmetrical with each other about a zero-order diffracted light beam from among output beams diffracted by the focus metrology mark of the to-be-measured substrate, wherein n is an integer equal to or greater than 1; a data storage comprising a first storage medium configured to store first data about defocus that is determined to have been experienced by the to-be-measured substrate during an exposure process, based on the powers of the ±n-order diffracted light beams; and a determination device comprising a first determination unit which determines defocus experienced by the feature pattern while being formed in an exposure apparatus, from a power deviation between the ±n-order diffracted light beams detected by the detection device, based on data stored in the data storage.

The plurality of metrology patterns may comprise a plurality of reference pattern groups spaced apart from each other at regular intervals in a first direction and a plurality of shift pattern groups that alternate with the plurality of reference pattern groups and are aligned with the plurality of reference pattern groups in a straight line in the first direction. The first data about the defocus may be data calculated based on a relative distance between at least one selected from the plurality of reference pattern groups and at least one selected from the plurality of shift pattern groups in the first direction.

The lithography metrology apparatus may further include a control device which calculates compensated focus data based on the defocus determined by the determination device. The data storage may further comprise a second storage medium configured to store second data including a depth of focus (DOF), which is the tolerance of defocus that is determined to have been experienced by the to-be-measured substrate during an exposure process. The determination device may further comprise a second determination unit which transmits a rework command for the to-be-measured substrate to the control device when the defocus deviates from the DOF.

The to-be-measured substrate may further comprise a micro diffraction based overlay (DBO) key formed simultaneously with the feature pattern. The detection device may further comprise a second detection unit configured to detect the powers of ±n-order diffracted light beams diffracted at identical angles so as to be symmetrical with each other about a zero-order diffracted light beam from among output beams diffracted by the micro-DBO key, wherein n is an integer equal to or greater than 1. The determination device may further comprise a second determination unit which determines an overlay error of the feature pattern from a power deviation between the ±n-order diffracted light beams detected by the second detection unit. The focus metrology mark and the micro-DBO key may be located within a one-time measurement spot formed by one shot of a radiation beam projected onto the to-be-measured substrate by the projection device.

The projection device may be configured to project at least two types of radiation beams polarized by the polarizer onto the to-be-measured substrate when the to-be-measured substrate does not move. In some embodiments, the at least two types of radiation beams may have different wavelengths and may be simultaneously incident on an identical location on the to-be-measured substrate. In other embodiments, the at least two types of radiation beams may be sequentially incident on an identical location on the to-be-measured substrate. In this case, the two types of radiation beams may have identical wavelengths.

The illumination device may generate a radiation beam having a wavelength of 230 to 850 nm.

In a lithography metrology method according to another aspect of the inventive concepts, a feature pattern and a focus metrology mark, the focus metrology mark comprising a plurality of metrology patterns spaced apart from each other to measure a focal variation of the feature pattern, are formed on a same level on a substrate via an exposure process. A radiation beam is radiated to be incident on the focus metrology mark. Powers of ±n-order diffracted light beams (where n is an integer equal to or greater than 1) diffracted at identical angles so as to be symmetrical with each other about a zero-order diffracted light beam from among output beams diffracted by the focus metrology mark are detected. Defocus that has been experienced by the substrate during an exposure process is inferred based on the powers of the ±n-order diffracted light beams.

The plurality of metrology patterns may comprise a plurality of reference pattern groups spaced apart from each other at regular intervals in a first direction and a plurality of shift pattern groups that alternate with the plurality of reference pattern groups and are aligned with the plurality of reference pattern groups in a straight line in the first direction. The determining of the defocus may be based on a relative distance between at least one selected from the plurality of reference pattern groups and at least one selected from the plurality of shift pattern groups in the first direction.

The to-be-measured substrate may further comprise a micro-DBO key which is formed simultaneously with the feature pattern and is formed to be located together with the focus metrology mark within a one-time measurement spot formed by one shot of a radiation beam that is incident on the substrate. The lithography metrology method may further comprise detecting the powers of ±n-order diffracted light beams diffracted at identical angles so as to be symmetrical with each other about a zero-order diffracted light beam from among output beams diffracted by the micro-DBO key, wherein n is an integer equal to or greater than 1; and determining an overlay error of the feature pattern from a power deviation between the ±n-order diffracted light beams obtained by the detection.

In the lithography metrology method, the determining of the overlay error may be performed simultaneously with the determining of the defocus.

In a method of manufacturing an IC device according to another aspect of the inventive concepts, a photoresist layer is formed on a substrate. The photoresist layer is exposed by applying a first focus set value. The exposed photoresist layer is developed to form a feature pattern on the substrate and simultaneously form a focus metrology mark on a same level as a level on which the feature pattern is formed on the substrate, the focus metrology mark comprising a plurality of metrology patterns spaced apart from each other to measure a focal variation of the feature pattern. A radiation beam is radiated to be incident on the focus metrology mark. Powers of ±n-order diffracted light beams (where n is an integer equal to or greater than 1) diffracted at identical angles so as to be symmetrical with each other about a zero-order diffracted light beam from among output beams diffracted by the focus metrology mark are detected. Defocus that the substrate has experienced during an exposure process is inferred based on the detected powers of the ±n-order diffracted light beams. It is determined whether the first focus set value is to be corrected, based on the inferred defocus.

The plurality of metrology patterns may comprise a plurality of reference pattern groups spaced apart from each other at regular intervals in a first direction and a plurality of shift pattern groups that alternate with the plurality of reference pattern groups and are aligned with the plurality of reference pattern groups in a straight line in the first direction. In the method of manufacturing an IC device, the determining of the defocus may be based on a relative distance between at least one selected from the plurality of reference pattern groups and at least one selected from the plurality of shift pattern groups in the first direction.

The method of manufacturing an IC device may further comprise inferring an overlay error of the feature pattern from the detected powers of the ±n-order diffracted light beams.

According to another aspect of the inventive concepts, there is provided an IC device comprising a plurality of patterns formed according to at least one selected from IC manufacturing methods according to embodiments of the inventive concepts as described above.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
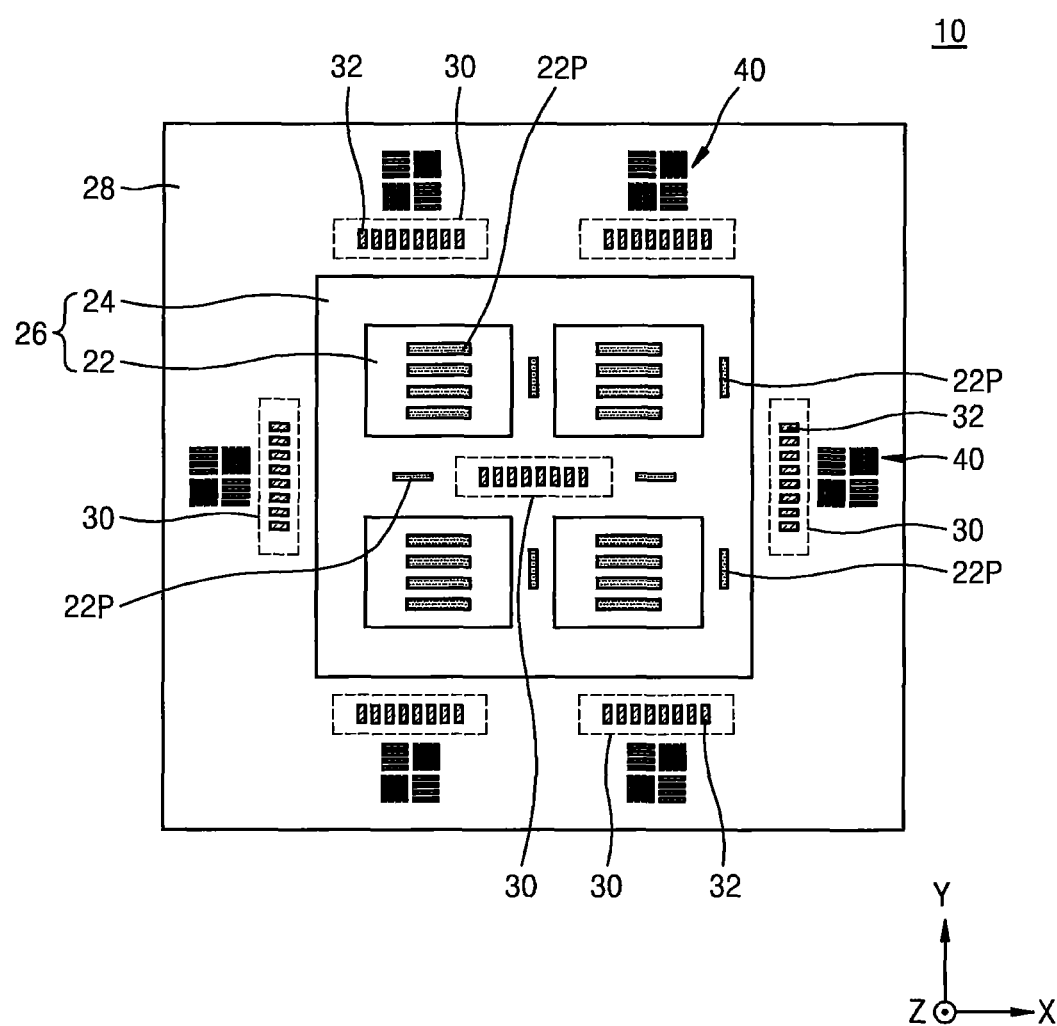
FIG. 1 is a schematic plan view of a photomask according to some embodiments of the inventive concepts.

Hereinafter, the inventive concepts will be described more fully with reference to the accompanying drawings, in which example embodiments of the inventive concepts are shown. Like reference numerals in the drawings denote like elements, and thus their description will be omitted.

The inventive concepts may, however, be embodied in many different forms and should not be construed as being limited to the embodiments set forth herein; rather, these embodiments are provided so that this disclosure will be thorough and complete, and will fully convey the inventive concepts to one of ordinary skill in the art.

It will be understood that, although the terms first, second, third, etc., may be used herein to describe various elements, regions, layers, sections, and/or components, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts. For example, a first component discussed below could be termed a second component, and similarly, a second component may be termed a first component without departing from the teachings of this disclosure.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concepts are not limited to the described order of the operations. For example, operations consecutively described herein may be simultaneously performed in practice, or may be executed in the opposite order to the described order.

Variations from the shapes of the illustrations as a result, for example, of manufacturing techniques and/or tolerances, are to be expected. Thus, embodiments of the inventive concepts should not be construed as being limited to the particular shapes of regions illustrated herein but are to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

Throughout the specification, the term "radiation" may refer to any electromagnetic radiation having various wavelengths, such as, but not limited to, ultraviolet (UV) radiation and/or extreme ultra-violet (EUV) radiation, and the term "beam" may refer to a particle beam, such as an ion beam and/or an electronic beam. Furthermore, the term "lens" may refer to any of various types of optical devices, such as a refractive optical device, a reflective optical device, a magnetic optical device, an electromagnetic optical device, and/or an electrostatic optical device. Throughout the specification, measuring focal variations of an exposure apparatus may include measuring the location of a focus and/or measuring an influence of the focal variations. The terms "measurement" and "inspection" may be understood to have the same meaning as each other, in some cases. The terms "determination" and "inferring" may be understood to have the same meaning as each other, in some cases.

Like reference numerals in the drawings denote like elements, and thus repeated descriptions thereof will be omitted.

FIG. 1 is a schematic plan view of a photomask 10 according to some embodiments of the inventive concepts.

Referring to FIG. 1, the photomask 10 may include a chip region 26 including a cell array region 22 and a peripheral circuit region 24.

In each of the cell array region 22 and the peripheral circuit region 24, main patterns 22P are formed. The main patterns 22P are used for forming a feature pattern that may be used to form an integrated circuit (IC) on a chip region on a wafer. The main patterns 22P may be formed of a light-shield pattern such as chrome (Cr), a phase inversion pattern, or a combination thereof, or may be formed of regions defined by the light-shield pattern, the phase inversion pattern, or the combination thereof.

The photomask 10 includes at least one focus metrology mark region 30. The focus metrology mark region 30 may be formed within the chip region 26 and/or outside the chip region 26 (that is, within a region 28 outside the chip region 26). The focus metrology mark region 30 may be formed to be spaced apart from the main patterns 22P.

The focus metrology mark region 30 includes a plurality of focus monitor patterns 32, which are formed simultaneously with the main patterns 22P. The plurality of focus monitor patterns 32 may be regions defined by a light-shield pattern such as Cr, a phase inversion pattern, or a combination thereof.

The photomask 10 may further include at least one overlay key pattern 40. The at least one overlay key pattern 40 may be formed within the chip region 26 and/or within the region 28 outside the chip region 26. In some embodiments, the at least one overlay key pattern 40 may be disposed adjacent to the focus metrology mark region 30.

Although the focus metrology mark region 30 is outside the cell array region 22 in FIG. 1, this is for convenience of explanation and illustration, and embodiments of the inventive concepts are not limited thereto. In some embodiments, the focus metrology mark region 30 may be formed within the cell array region 22 such that it is spaced apart from the main patterns 22P.

Figure 2:
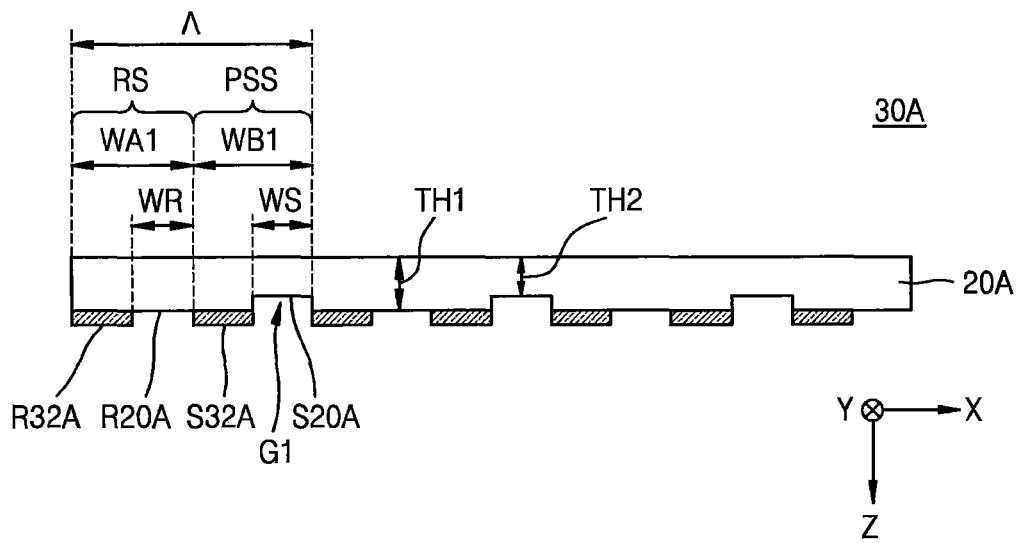
FIG. 2 is a cross-sectional view of a focus metrology mark region of a photomask according to some embodiments of the inventive concepts.

FIG. 2 is a cross-sectional view of a focus metrology mark region 30A of a photomask according to some embodiments of the inventive concepts. The focus metrology mark region 30A of FIG. 2 may constitute or define the focus metrology mark region 30 of FIG. 1 in some embodiments.

Referring to FIG. 2, the focus metrology mark region 30A includes a transparent substrate 20A, a plurality of reference sections RS formed on the transparent substrate 20A, and a plurality of phase shift sections PSS formed on the transparent substrate 20A.

Each of the plurality of reference sections RS includes a reference light-transmissive region R20A not changing the phase of light that passes through the transparent substrate 20A, and a reference light-shield pattern R32A covering the transparent substrate 20A in order to define the reference light-transmissive region R20A.

Each of the plurality of phase shift sections PSS includes a shift light-transmissive region S20A causing a phase shift of non-180° to occur in the light passing through the transparent substrate 20A, and a shift light-shield pattern S32A covering the transparent substrate 20A in order to define the shift light-transmissive region S20A.

In the transparent substrate 20A, the shift light-transmissive region S20A includes a groove G1 formed therein. Accordingly, a thickness TH2 of the shift light-transmissive region S20A is smaller than a thickness TH1 of the reference light-transmissive region R20A. The groove G1 has a depth that enables a difference between the phase of light passing through the reference light-transmissive region R20A and that of light passing through the shift light-transmissive region S20A to be a value other than 180°.

For example, a width WR of the reference light-transmissive region R20A in a first direction (i.e., an X direction of FIG. 2) may be set to be equal to a width WS of the shift light-transmissive region S20A in the first direction. In another example, the width WR of the reference light-transmissive region R20A may be set to be greater than the width WS of the shift light-transmissive region S20A.

A ratio of a width of the reference light-shield pattern R32A in the first direction and the width WR of the reference light-transmissive region R20A may be 1:1. A ratio of a width of the shift light-shield pattern S32A in the first direction and the width WS of the shift light-transmissive region S20A may be 1:1.

The plurality of reference sections RS and the plurality of phase shift sections PSS may be arranged in a line along the first direction. The plurality of reference sections RS and the plurality of phase shift sections PSS may also alternate with each other in the first direction.

A pattern pitch Λ of the focus metrology mark region 30A may be determined according to a width WA1 of a reference section RS of one cycle or period from among the plurality of reference sections RS and a width WB1 of a phase shift section PSS of one cycle or period from among the plurality of phase shift sections PSS. In the example of FIG. 2, the pattern pitch Λ of the focus metrology mark region 30A is a sum of the width WA1 of the reference section RS of one cycle and the width WB1 of the phase shift section PSS of one cycle.

In the example of FIG. 2, each of the plurality of reference sections RS is a reference section of one cycle or period including one reference light-shield pattern R32A and one reference light-transmissive region R20A in the first direction (i.e., the X direction of FIG. 2), and each of the plurality of phase shift sections PSS is a phase shift section of one cycle or period including one shift light-shield pattern S32A and one shift light-transmissive region S20A in the first direction (i.e., the X direction of FIG. 2).

However, embodiments of the inventive concepts are not limited to the example of FIG. 2.

In some embodiments, each of the plurality of reference sections RS may be formed of reference sections of a plurality of cycles including a plurality of reference light-shield patterns R32A and a plurality of reference light-transmissive regions R20A in the first direction, and each of the plurality of phase shift sections PSS may be a phase shift section of one cycle or period including one shift light-shield pattern S32A and one shift light-transmissive region S20A in the first direction.

In other embodiments, each of the plurality of reference sections RS may be a reference section of one cycle or period including one reference light-shield pattern R32A and one reference light-transmissive region R20A in the first direction, and each of the plurality of phase shift sections PSS may be formed of phase shift sections of a plurality of cycles or periods including a plurality of shift light-shield patterns S32A and a plurality of shift light-transmissive regions S20A in the first direction.

In other embodiments, each of the plurality of reference sections RS may be formed of reference sections of a plurality of cycles or periods including a plurality of reference light-shield patterns R32A and a plurality of reference light-transmissive regions R2QA in the first direction, and each of the plurality of phase shift sections PSS may be formed of phase shift sections of a plurality of cycles or periods including a plurality of shift light-shield patterns S32A and a plurality of shift light-transmissive regions S20A in the first direction.

Figure 3:
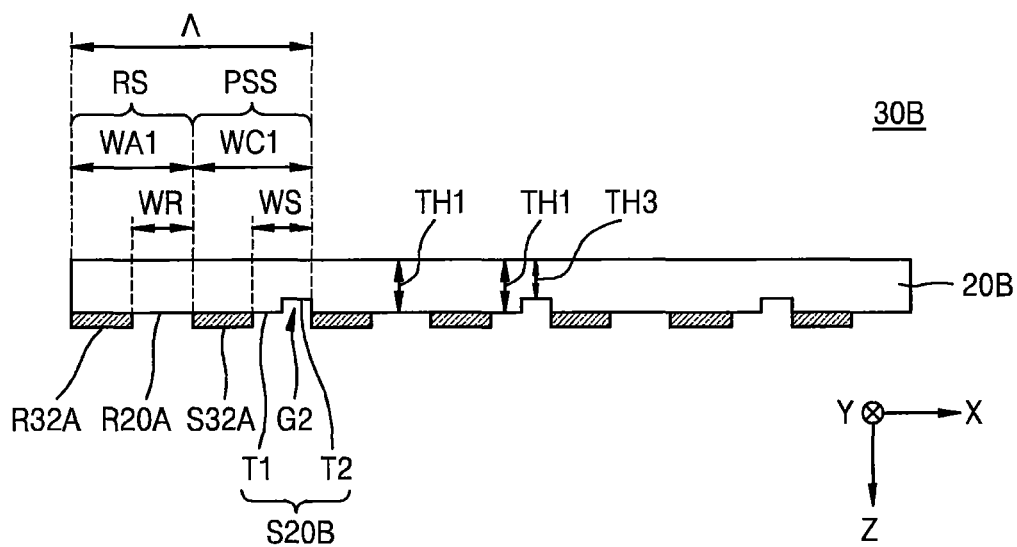
FIG. 3 is a cross-sectional view of a focus metrology mark region of a photomask according to other embodiments of the inventive concepts.

FIG. 3 is a cross-sectional view of a focus metrology mark region 30B of a photomask according to some embodiments of the inventive concepts. The focus metrology mark region 30B of FIG. 3 may constitute or define the focus metrology mark region 30 of FIG. 1. The same reference numerals in FIG. 3 as those in FIG. 2 denote the same or similar elements, and thus detailed descriptions thereof will be omitted.

Referring to FIG. 3, the focus metrology mark region 30B includes a transparent substrate 20B, a plurality of reference sections RS formed on the transparent substrate 20B, and a plurality of phase shift sections PSS formed on the transparent substrate 20B.

Each of the plurality of reference sections RS includes a reference light-transmissive region R20A and a reference light-shield pattern R32A.

Each of the plurality of phase shift sections PSS includes a shift light-transmissive region S20B causing a phase shift of non-180° to occur in light passing through the transparent substrate 20B, and a shift light-shield pattern S32A covering the transparent substrate 20B in order to define the shift light-transmissive region S20B.

The shift light-transmissive region S20B includes a first light-transmissive portion T1 having a thickness TH1 that is equal to a thickness of the reference light-transmissive region R20A, and a second light-transmissive portion T2 having a groove G2 such as to have a thickness TH3 that is smaller than the thickness of the reference light-transmissive region R20A. The first light-transmissive portion T1 may have the same phase as that of the reference light-transmissive region R20A. A difference between the phases of the first and second light-transmissive portions T1 and T2 is a value other than 180°.

A pattern pitch Λ of the focus metrology mark region 30B may be determined according to a width WA1 of a reference section RS of one cycle from among the plurality of reference sections RS and a width WC1 of a phase shift section PSS of the one cycle. In the example of FIG. 3, the pattern pitch Λ of the focus metrology mark region 30B is a sum of the width WA1 of the reference section RS of one cycle and the width WC1 of the phase shift section PSS of the one cycle.

In the phase shift section PSS, a ratio of a width of the shift light-shield pattern S32A, a width of the first light-transmissive portion T1, and a width of the second light-transmissive portion T2 in a first direction (i.e., an X direction of FIG. 3) may be 2:1:1.

In the example of FIG. 3, each of the plurality of reference sections RS is a reference section of one cycle including one reference light-shield pattern R32A and one reference light-transmissive region R20A in the first direction, and each of the plurality of phase shift sections PSS is a phase shift section of one cycle including one shift light-shield pattern S32A and one shift light-transmissive region S20B in the first direction.

However, embodiments of the inventive concepts are not limited to the example of FIG. 3. Similar to the above description with reference to FIG. 2, each of the plurality of reference sections RS may be formed of a reference section of at least one cycle including at least one reference light-shield pattern R32A and at least one reference light-transmissive region R20A. Each of the plurality of phase shift sections PSS may be a phase shift section of at least one cycle including at least one shift light-shield pattern S32A and at least one shift light-transmissive region S20A.

FIGS. 4A-4D are respectively cross-sectional views of focus metrology mark regions 30C, 30D, 30E, and 30F that may be included in a photomask according to some embodiments of the inventive concepts. Each of the focus metrology mark regions 30C, 30D, 30E, and 30F of FIGS. 4A-4D may constitute or define the focus metrology mark region 30 of the photomask 10 of FIG. 1. The same reference numerals in FIGS. 4A-4D as those in FIG. 2 denote the same or similar elements, and thus detailed descriptions thereof will be omitted.

Figure 4A:
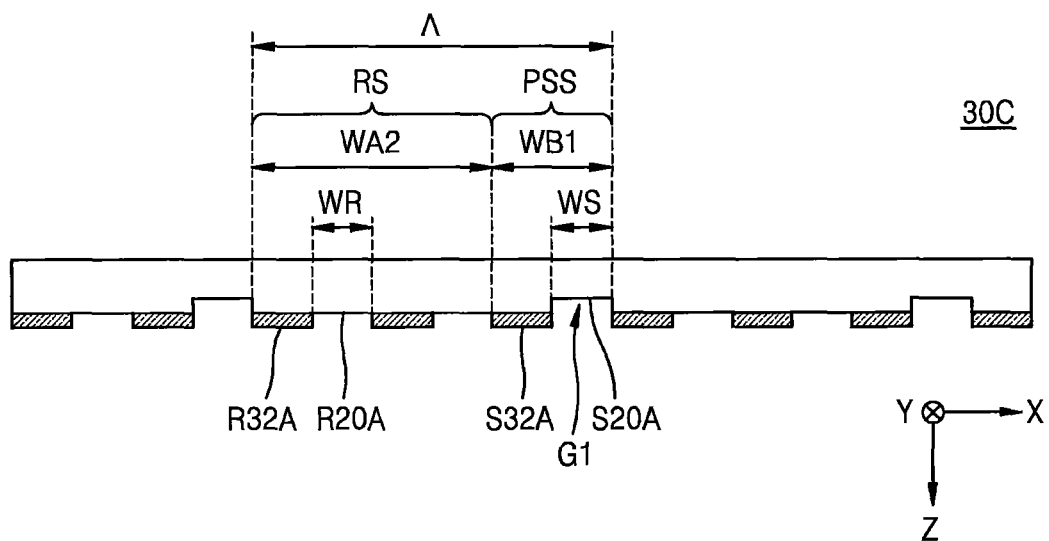
FIGS. 4A-4D are respectively cross-sectional views of example focus metrology mark regions that may be included in a photomask according to some embodiments of the inventive concepts.

In the focus metrology mark region 30C of FIG. 4A, each of a plurality of reference sections RS is formed of two cycles including two reference light-shield patterns R32A and two reference light-transmissive regions R20A. Similar to the focus metrology mark region 30A of FIG. 2, each of a plurality of phase shift sections PSS is a phase shift section of one cycle including one shift light-shield pattern S32A and one shift light-transmissive region S20A.

In the example of FIG. 4A, a pattern pitch Λ of the focus metrology mark region 30C is a sum of a width WA2 of the reference section RS of two cycles and the width WB1 of the phase shift section PSS of one cycle.

Figure 4B:
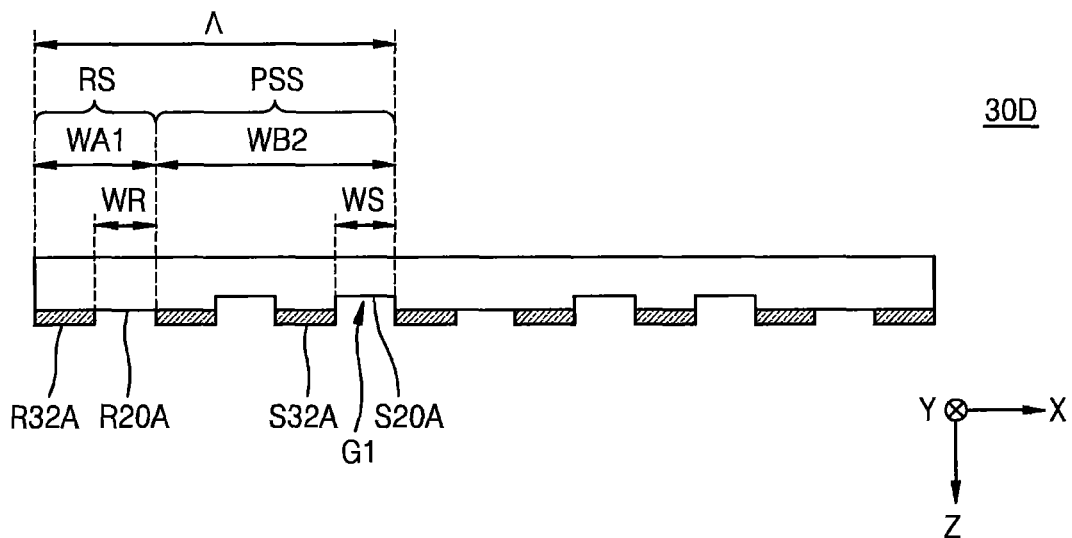

In the focus metrology mark region 30D of FIG. 4B, each of a plurality of reference sections RS is formed of one cycle including one reference light-shield patterns R32A and one reference light-transmissive region R20A. Each of a plurality of phase shift sections PSS may be formed of two cycles including two shift light-shield patterns S32A and two shift light-transmissive regions S20A.

In the example of FIG. 4B, a pattern pitch Λ of the focus metrology mark region 30D is a sum of a width WA1 of a reference section RS of one cycle and a width WB2 of phase shift sections PSS of two cycles.

Figure 4C:
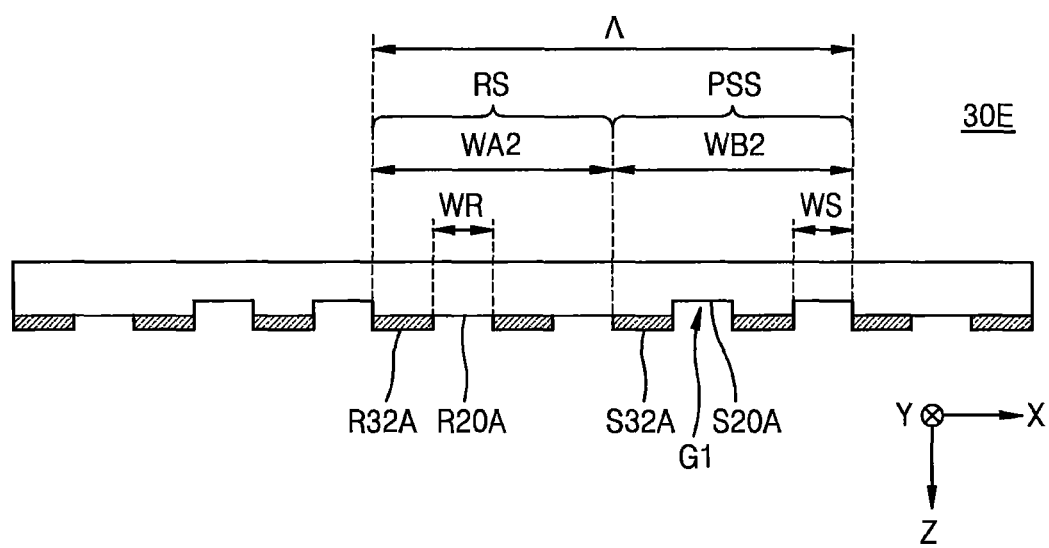

In the focus metrology mark region 30E of FIG. 4C, each of a plurality of reference sections RS is formed of two cycles including two reference light-shield patterns R32A and two reference light-transmissive regions R20A. Each of a plurality of phase shift sections PSS may be formed of two cycles including two shift light-shield patterns S32A and two shift light-transmissive regions S20A.

In the example of FIG. 4C, a pattern pitch Λ of the focus metrology mark region 30E is a sum of a width WA2 of reference sections RS of two cycles and a width WB2 of phase shift sections PSS of two cycles.

Figure 4D:
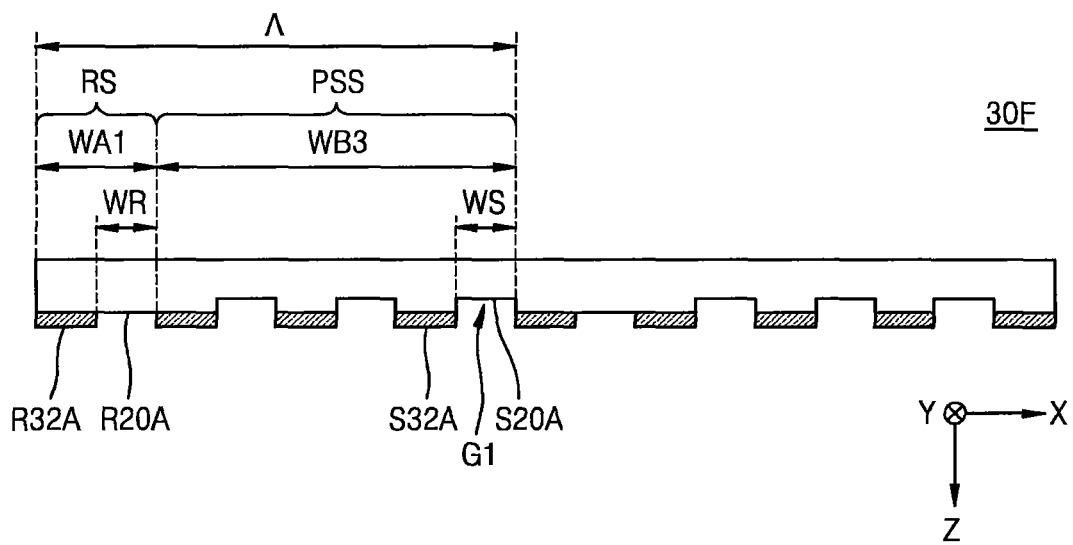

In the focus metrology mark region 30F of FIG. 4D, each of a plurality of reference sections RS is a reference section of one cycle including one reference light-shield pattern R32A and one reference light-transmissive region R20A. Each of a plurality of phase shift sections PSS is formed of three cycles including three shift light-shield patterns S32A and three shift light-transmissive regions S20A.

In the example of FIG. 4D, a pattern pitch Λ of the focus metrology mark region 30F is a sum of the width WA1 of a reference section RS of one cycle and a width WB3 of phase shift sections PSS of three cycles.

FIGS. 5A-5F are cross-sectional views for explaining a method of fabricating a photomask according to some embodiments of the inventive concepts. In the present embodiment, a case where the photomask 30A of FIG. 2 is manufactured is illustrated.

Figure 5A:
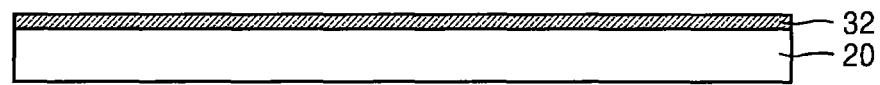
FIGS. 5A-5F are cross-sectional views for explaining a method of fabricating a photomask according to embodiments of the inventive concepts.

Referring to FIG. 5A, a light-reflective layer 32 is formed on a transparent substrate 20.

The transparent substrate 20 may be formed of quartz. The light-reflective layer 32 may be formed of Cr.

Figure 5B:
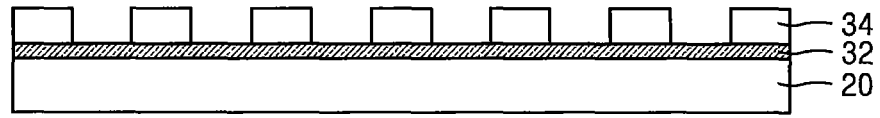

Referring to FIG. 5B, a resist layer is formed on the light-reflective layer 32 and then undergoes exposure and development, thereby forming a first resist pattern 34.

Figure 5C:
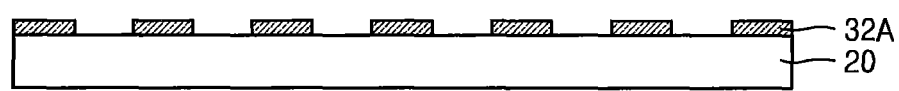

Referring to FIG. 5C, the light-reflective layer 32 is etched using the first resist pattern 34 as an etch mask to thereby form a plurality of light-shield patterns 32A.

Thereafter, the first resist pattern 34 is removed.

Figure 5D:
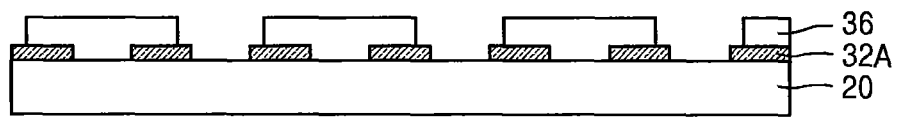

Referring to FIG. 5D, another resist layer is formed on the plurality of light-shield patterns 32A and then undergoes exposure and development, thereby forming a second resist pattern 36. The second resist pattern 36 covers portions of the transparent substrate 20 which are to be the reference light-transmissive regions R20A, and the plurality of light-shield patterns 32A.

Figure 5E:
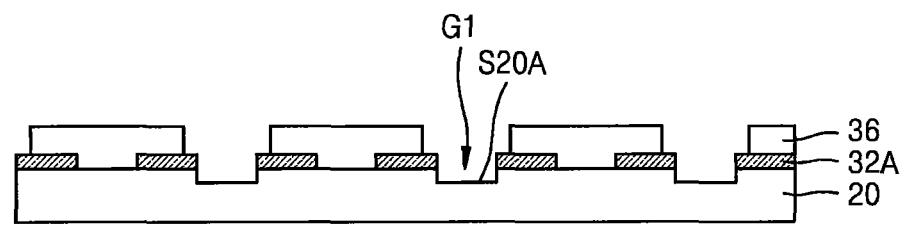

Referring to FIG. 5E, the transparent substrate 20 is etched using the second resist pattern 36 and exposed portions of the plurality of light-shield patterns 32A as an etch mask, thereby forming a plurality of shift light-transmissive regions S20A. The plurality of shift light-transmissive regions S20A include the grooves G1 having depths that enable a phase shift of an angle other than 180° to occur in light passing through the transparent substrate 20.

Figure 5F:
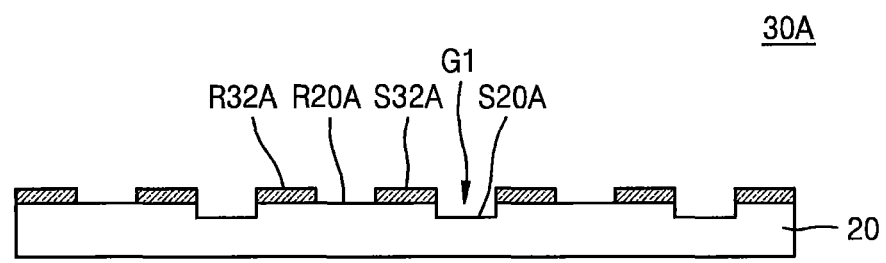

Referring to FIG. 5F, the second resist pattern 36 is removed to expose the reference light-transmissive regions R20A, the reference light-shield patterns R32A, and the shift light-shield patterns S32A, thereby completing the fabrication of the photomask 30A.

FIGS. 6A-6D are cross-sectional views for explaining a method of fabricating a photomask according to other embodiments of the inventive concepts. In the present embodiment, a case where the photomask 30B of FIG. 3 is manufactured is illustrated.

Figure 6A:
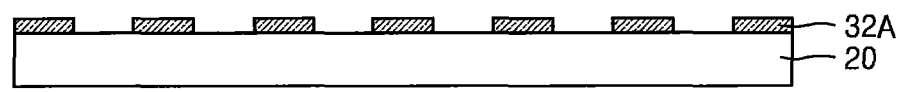
FIGS. 6A-6D are cross-sectional views for explaining a method of fabricating a photomask according to other embodiments of the inventive concepts.

Referring to FIG. 6A, a plurality of light-shield patterns 32A are formed on the transparent substrate 20 according to processes as described above with reference to FIGS. 5A-5C.

Figure 6B:
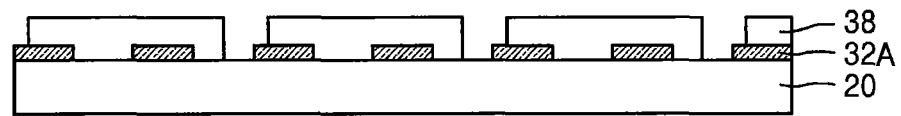

Referring to FIG. 6B, a resist layer is formed on the plurality of light-shield patterns 32A and then undergoes exposure and development, thereby forming a third resist pattern 38. The third resist pattern 38 covers portions of the transparent substrate 20 which are to be the reference light-transmissive regions R20A, portions of the shift light-transmissive regions S20B which are to be the first light-transmissive portions T1, and the plurality of light-shield patterns 32A.

Figure 6C:
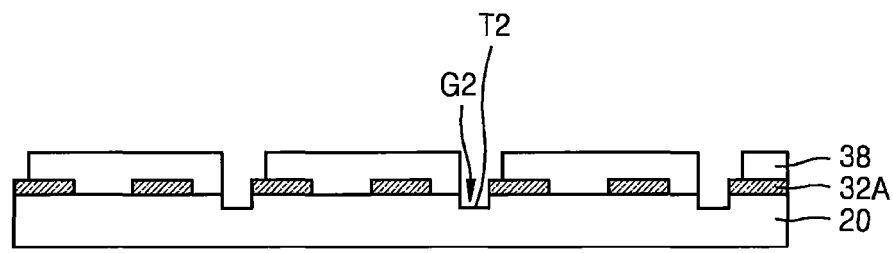

Referring to FIG. 6C, the transparent substrate 20 is etched using the third resist pattern 38 and exposed portions of the plurality of light-shield patterns 32A as an etch mask, thereby forming second light-transmissive portions T2 including the grooves G2.

Figure 6D:
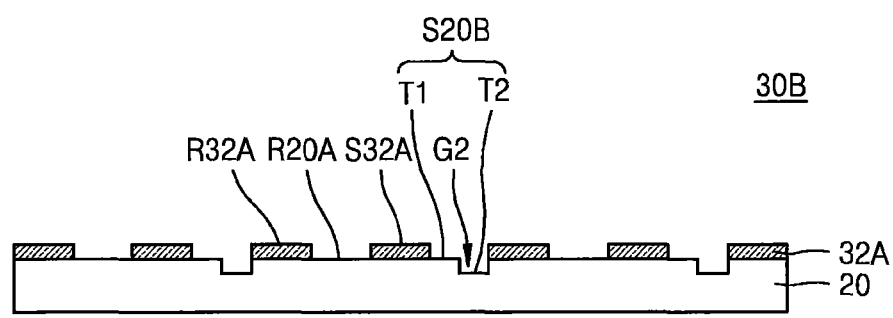

Referring to FIG. 6D, the third resist pattern 38 is removed to expose the reference light-transmissive regions R20A, the reference light-shield patterns R32A, the shift light-shield patterns S32A, and the first light-transmissive portions T1, thereby completing the fabrication of the photomask 30B.

Although the method of forming the photomask 30A of FIG. 2 and the method of forming the photomask 30B of FIG. 3 have been described above with reference to FIGS. 5A-6D, the photomasks 30C, 30D, 30E, and 30F of FIGS. 4A-4D having other structures than the structures of the photomasks 30A and 30B may be formed according to a similar method to the methods described above with reference to FIGS. 5A-6D.

Figure 7:
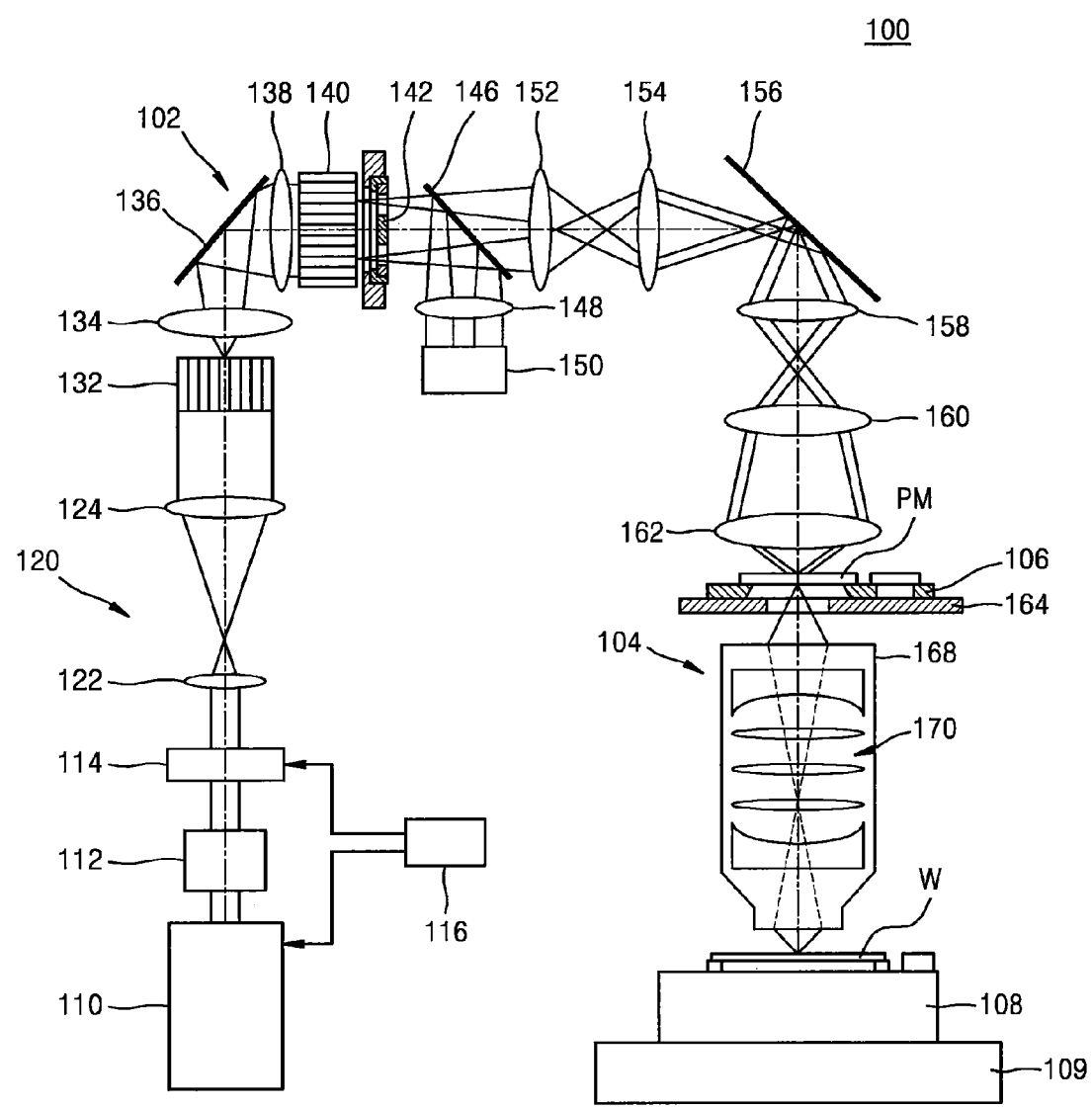
FIG. 7 is a schematic diagram of an exposure apparatus which may be used to form a substrate target for lithography metrology according to embodiments of the inventive concepts by using a photomask according to embodiments of the inventive concepts.

FIG. 7 is a schematic diagram of an exposure apparatus 100 which may be used to form a substrate target for lithography metrology according to embodiments of the inventive concepts by using a photomask according to embodiments of the inventive concepts.

Referring to FIG. 7, the exposure apparatus 100 includes a light source 110 and an illumination optical system 102 for guiding light generated by the light source 110 onto a photomask PM. The photomask PM includes a plurality of light-shield patterns for transferring a desired pattern onto a wafer W having an upper surface covered with a photoresist layer. The photomask PM may be the photomask 10 of FIG. 1.

For example, the light source 110 may use a g-line light beam that is generated by a mercury lamp and has a wavelength of 436 nm, an i-line light beam that is generated by a mercury lamp and has a wavelength of 365 nm, a KrF laser beam that is generated by a KrF excimer laser and has a wavelength of 248 nm, an ArF laser beam that is generated by an ArF excimer laser and has a wavelength of 198 nm, or an F2 laser beam that is generated by a F2 excimer laser and has a wavelength of 157 nm.

The exposure apparatus 100 also includes a reticle stage 106 supporting the photomask PM, a projection optical system 104 for projecting projection light transmitted by the photomask PM onto the wafer W, and a wafer stage 108 for supporting the wafer W.

The projection optical system 104 may include a housing 168 for sealing the projection optical system 104 to prevent external air from getting in, and a projection lens array 170 included in the housing 168 and including a plurality of projection lenses.

A light beam radiated by the light source 110 may be incident on a beam shaping unit 120 via a beam matching unit (BMU) 112 and a light attenuator 114. The beam shaping unit 120 may include a first lens unit 122 and a second lens unit 124, which are arranged along a preset optical axis.

An exposure control system 116 controls the amount of exposure of the photoresist layer formed on the wafer W. The exposure control system 116 may control a start and a conclusion of light emission of the light source 110, an oscillation frequency of output light, and pulse energy of the output light and may adjust a dimming ratio of the light attenuator 114 consecutively or in stages.

The illumination optical system 102 may include a first fly's eye system 132, a third lens unit 134, a first reflection mirror 136, a fourth lens unit 138, a second fly's eye system 140, an aperture plate 142, a beam splitter 146, a light-collecting lens 148, an integration sensor 150, a second reflection mirror 156, an image-formation lens unit 158, an auxiliary light-collecting lens unit 160, and a main light-collecting lens unit 162.

A light beam transmitted by the beam shaping unit 120 may be incident on the first fly's eye system 132, which is capable of functioning as a first-stage optical integrator or a uniformizer. A light beam emitted by the first fly's eye system 132 may be incident on the first reflection mirror 136, which functions as an optical path-bending member, via the third lens unit 134, and light reflected by the first reflection mirror 136 may be incident on the second fly's eye system 140, which functions as a second-stage optical integrator, via the fourth lens unit 138. The third lens unit 134 and the fourth lens unit 138 may constitute or define a relay optical unit that functions as a light-collecting optical unit.

A light beam emitted from the second fly's eye system 140 passes through the aperture plate 142, which is selected according to the shape of a reticle pattern, and thus illumination light having a specific shape may be generated.

The illumination light may be incident on the beam splitter 146 via the aperture plate 142 and may be incident on the integration sensor 150, including a photoelectric detector, via the light-collecting lens 148. A detection signal of the integration sensor 150 may be provided to the exposure control system 116. The exposure control system 116 may indirectly monitor the luminous intensity of the illumination light and an integration value of the luminous intensity according to the detection signal.

Illumination light transmitted by the beam splitter 146 may sequentially pass through a fifth lens unit 152 and a sixth lens unit 154 and then may be reflected by the second reflection mirror 156 toward the image-formation lens unit 158. Illumination light transmitted by the image-formation lens unit 158 may sequentially pass through the auxiliary light-collecting lens unit 160 and the main light-collecting lens unit 162 and then may be incident on the photomask PM.

The reticle stage 106 may be disposed on a reticle base 164 such that it may be movable under the main light-collecting lens unit 162. The reticle stage 106 may be disposed such that it may perform fine precision rectilinear movements in X-axis and Y-axis directions and a rotation while the wafer W is undergoing an exposure process.

Illumination light transmitted by the photomask PM may be projected onto the wafer W via the projection optical system 104. The wafer stage 108, supporting the wafer W, may be disposed to be two-dimensionally movable on a wafer base 109, and may be moved in a direction opposite to a moving direction of the reticle stage 106 while the exposure apparatus 100 is performing an exposure process. In addition, to repeatedly perform an exposure process on shot regions of the wafer W, the wafer stage 108 may move in the X-axis and Y-axis directions in a stepping manner. A levelling mechanism of the wafer stage 108 is driven based on a measured value of an auto-focusing sensor (not shown), and thus a light-focused location on the wafer W may be adjusted.

FIGS. 8A-8E are views for explaining relative shift amounts of photoresist patterns obtained by performing exposure on the wafer W including the photoresist layer formed thereon by using a photomask according to embodiments of the inventive concepts and then developing the exposed wafer W. Although the exposure process may be performed using the exposure apparatus 100 of FIG. 7, embodiments of the inventive concepts are not limited thereto.

Figure 8A:
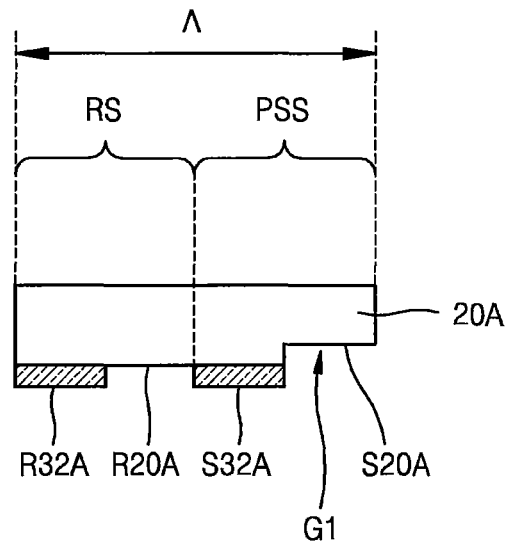
FIG. 8 is a view for explaining relative shift amounts of photoresist patterns obtained via an exposure process in which a photomask according to embodiments of the inventive concepts is used.

FIG. 8A illustrates only the pattern pitch Λ of the focus metrology mark region 30A of FIG. 2, which includes a reference section RS of one cycle and a phase shift section PSS of one cycle.

Figure 8B:
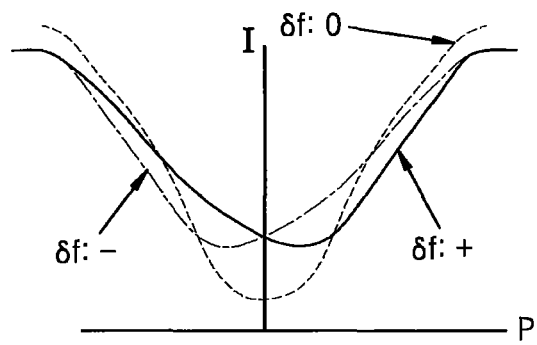

FIG. 8B is a graph showing aerial image intensities I (arbitrary unit) at focus locations according to positions P (arbitrary unit) on a wafer, when defocus is 0 ($\delta f$: 0), when defocus is (+) ($\delta f$: +), and when defocus is (−) ($\delta f$: −).

Figure 8C:
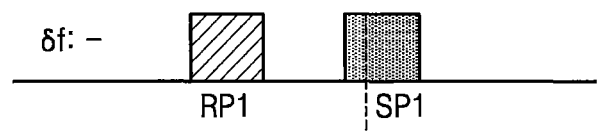

FIG. 8C illustrates positions of a reference pattern RP1 and a shift pattern SP1 from among photoresist patterns formed on the wafer W via the reference section RS and the phase shift section PSS of the focus metrology mark region 30A when defocus is (−) ($\delta f$: −).

Figure 8D:
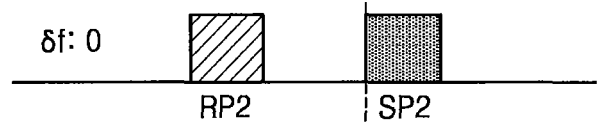

FIG. 8D shows positions of a reference pattern RP2 and a shift pattern SP2 from among photoresist patterns formed on the wafer W via the reference section RS and the phase shift section PSS of the focus metrology mark region 30A when defocus is (0) ($\delta f$: 0).

Figure 8E:
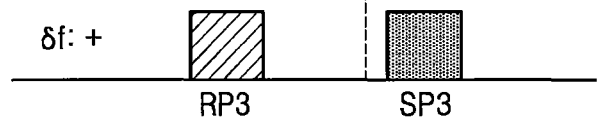

FIG. 8E shows positions of a reference pattern RP3 and a shift pattern SP3 from among photoresist patterns formed on the wafer W via the reference section RS and the phase shift section PSS of the focus metrology mark region 30A when defocus is (+) ($\delta f$: +).

As shown in FIGS. 8C and 8E, the positions of the shift patterns SP1 and SP3 from among the photoresist patterns formed on the wafer W when defocus is (−) and when defocus is (+) may be respectively shifted in opposite directions from the position of the shift pattern SP2 formed when defocus is (0).

Relative positions of the shift patterns SP1, SP2, and SP3 in relation to the reference patterns RP1, RP2, and RP3 are proportional to focal variations that occur during exposure.

A dual lattice including the reference patterns RP1, RP2, and RP3 and the shift patterns SP1, SP2, and SP3 may be formed on the wafer W by using an exposure process using a photomask having the focus metrology mark region 30A including the reference section RS and the phase shift section PSS, and the intensity of light diffracted by the dual lattice may vary in proportion to the relative positions of the shift patterns SP1, SP2, and SP3 in relation to the reference patterns RP1, RP2, and RP3.

When focal variations occur during an exposure process, the shift patterns SP1, SP2, and SP3 are shifted horizontally from a position that is obtainable when defocus is 0, in proportion to the magnitudes and directions of the focal variations. However, the reference patterns RP1, RP2, and RP3 are not shifted from a position obtainable when defocus is 0, even when focal variations occur during an exposure process.

For example, when the power of −1-order diffracted light output by the dual lattice is measured to be greater than that of +1-order diffracted light output thereby, defocus may be (+). When the power of the −1-order diffracted light is measured to be equal to that of the +1-order diffracted light, defocus may be 0. When the power of the −1-order diffracted light is measured to be smaller than that of the +1-order diffracted light, defocus may be (−).

Based on this principle, the powers of ±n-order diffracted light beams (that is, beams having a same diffraction order n, where n is an integer equal to or greater than 1) from among diffracted light beams output by the dual lattice including the reference patterns RP1, RP2, and RP3 and the shift patterns SP1, SP2, and SP3 may be analyzed, and thus the magnitudes and directions of focal variations experienced during the exposure process may be inferred.

Although the principle of inferring the magnitudes and directions of focal variations experienced during an exposure process by analyzing the intensity of diffracted light output by a dual lattice in the case of the focus metrology mark region 30A of FIG. 2 has been described above with reference to FIGS. 8A-8E, this principle is not limited to the case of the focus metrology mark region 30A, and the same principle or a similar principle may be applied to photomasks according to embodiments of the inventive concepts.

Figure 9A:
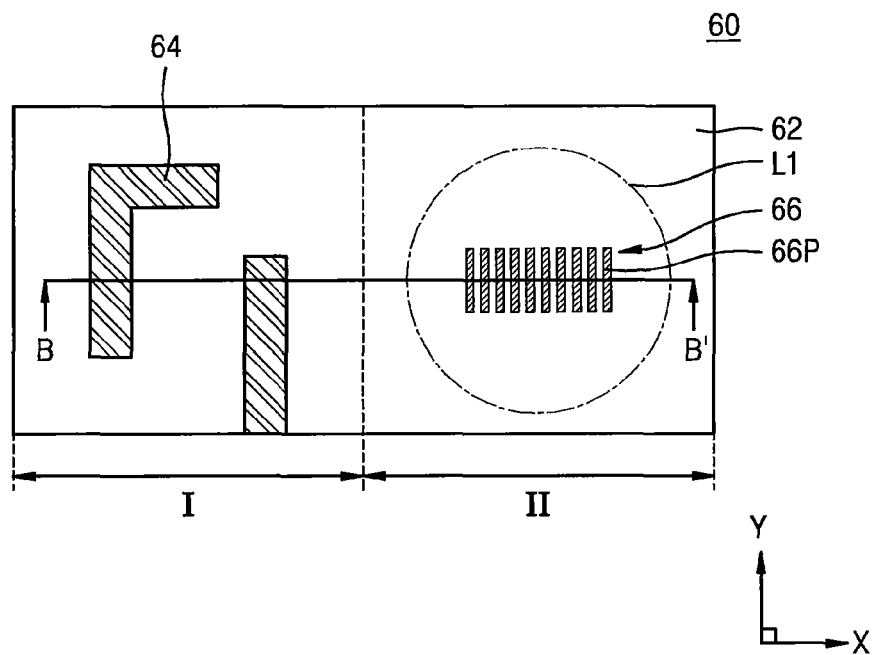
FIG. 9A is a plan view of a substrate target for lithography metrology according to some embodiments of the inventive concepts.

FIG. 9A is a plan view of a substrate target 60 for lithography metrology according to some embodiments of the inventive concepts.

Figure 9B:
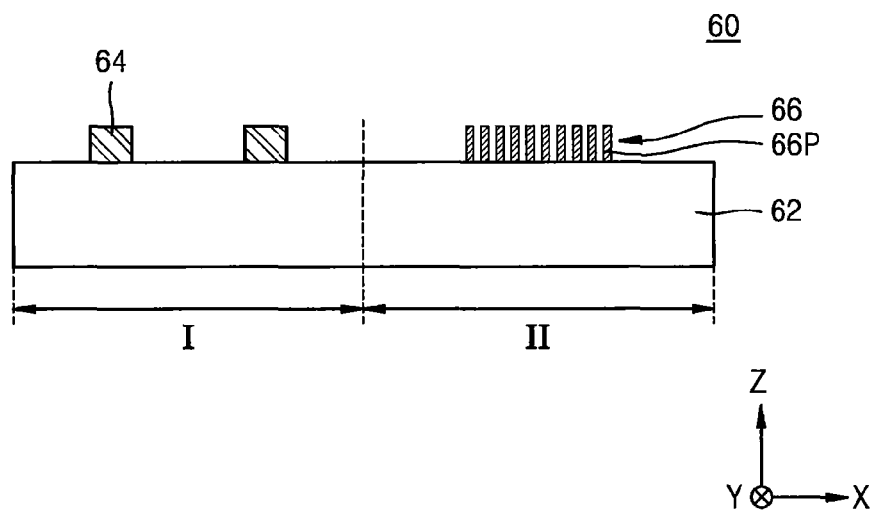
FIG. 9B is a cross-sectional view taken along line B-B' of FIG. 9A.

FIG. 9B is a cross-sectional view taken along line B-B' of FIG. 9A.

Referring to FIGS. 9A and 9B, the substrate target 60 for lithography metrology includes a substrate 62, a plurality of feature patterns 64 formed on a first region I on the substrate 62, and a focus metrology mark 66 formed on a second region II on the substrate 62 to measure a focal variation inferred to have been experienced by the plurality of feature patterns 64 during an exposure process for forming the plurality of feature patterns 64.

The focus metrology mark 66 may include a plurality of metrology patterns 66P formed on the same level as that on which the plurality of feature patterns 64 are formed. Although the plurality of metrology patterns 66P may be illustrated as linear planar structures that are parallel to each other, embodiments of the inventive concepts are not limited thereto, and the plurality of metrology patterns 66P may have any of various plane shapes.

The plurality of metrology patterns 66P of the focus metrology mark 66 may be formed of the same material as that used to form the plurality of feature patterns 64. In some embodiments, the plurality of feature patterns 64 and the plurality of metrology patterns 66P may be resist patterns.

Figure 16:
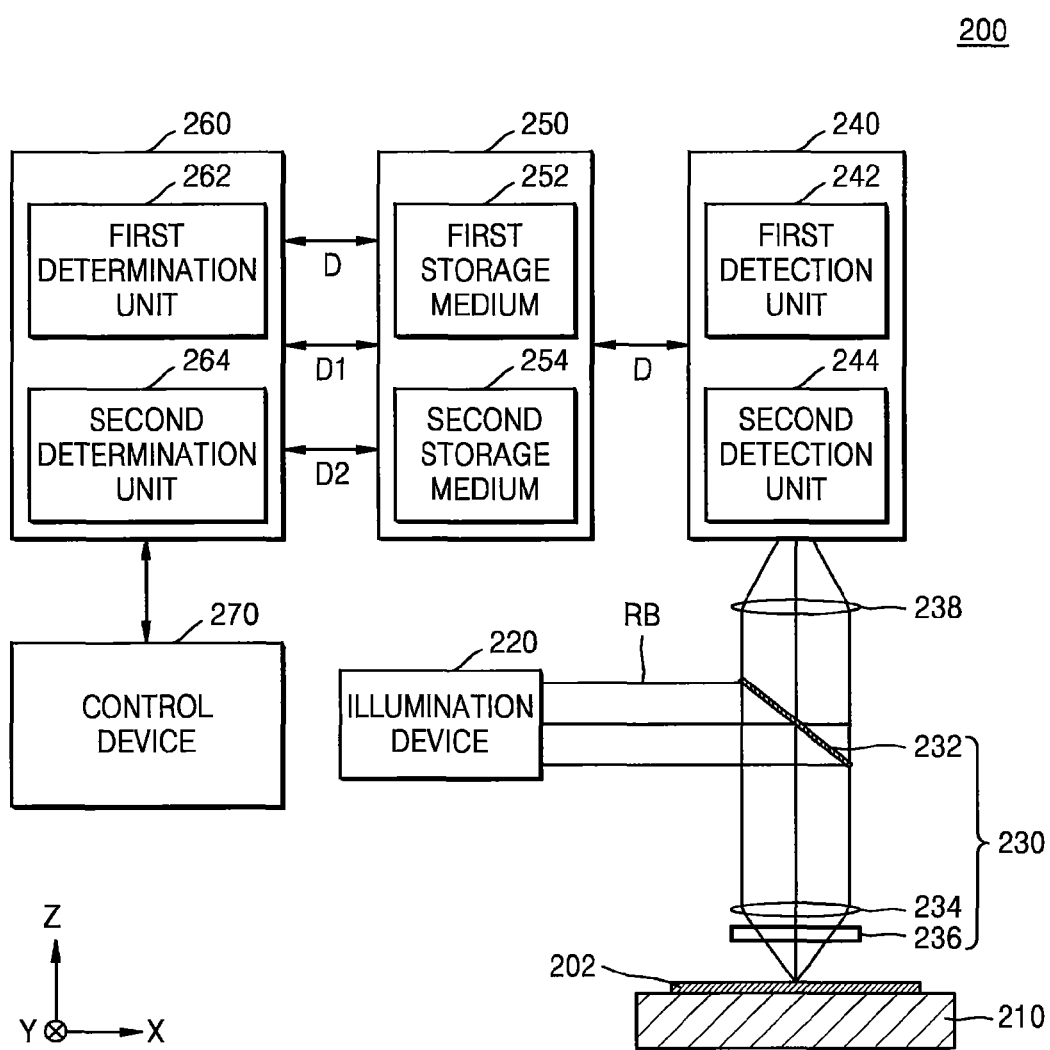
FIG. 16 is a schematic diagram showing a structure of a lithography metrology apparatus according to embodiments of the inventive concepts.

On the second region II of the substrate 62, the plurality of metrology patterns 66P of the focus metrology mark 66 may be formed within a one-time measurement spot formed by one shot of a radiation beam generated by a lithography metrology apparatus for measuring a focal variation of the plurality of feature patterns 64, for example, a lithography metrology apparatus 200 of FIG. 16. In FIG. 9A, the one-time measurement spot may be indicated by a dot-dash line L1.

In the case of the focus metrology mark 66 illustrated in FIGS. 9A and 9B, the plurality of metrology patterns 66P may be simultaneously irradiated by one shot of the radiation beam generated by the lithography metrology apparatus. The number of metrology patterns 66P that constitute or define the focus metrology mark 66 is not limited to that illustrated in FIGS. 9A and 9B, and the substrate target 60 may include a focus metrology mark 66 including any of various numbers of metrology patterns within the scope of the inventive concepts.

The first region I on which the plurality of feature patterns 64 are formed may correspond to a pattern region on which patterns that may be necessary for forming some unit devices of an IC device are formed. The second region II on which the focus metrology mark 66 is formed may be free of the feature patterns 64 or may otherwise correspond to a portion of the pattern region on which the plurality of feature patterns 64 are not disposed. Alternatively, the focus metrology mark 66 may be formed on a scribe lane region on the substrate 62.

FIG. 9B illustrates a case where each of the plurality of metrology patterns 66P defining the focus metrology mark 66 has a rectangular cross-sectional shape. However, substrate targets according to embodiments of the inventive concepts are not limited to the rectangular cross-sectional shape of each of the plurality of metrology patterns 66P illustrated in FIG. 9B, and they may include a plurality of metrology patterns each having any of various cross-sectional shapes, for example, a trapezoidal cross-sectional shape or a triangular cross-sectional shape.

Figure 10:
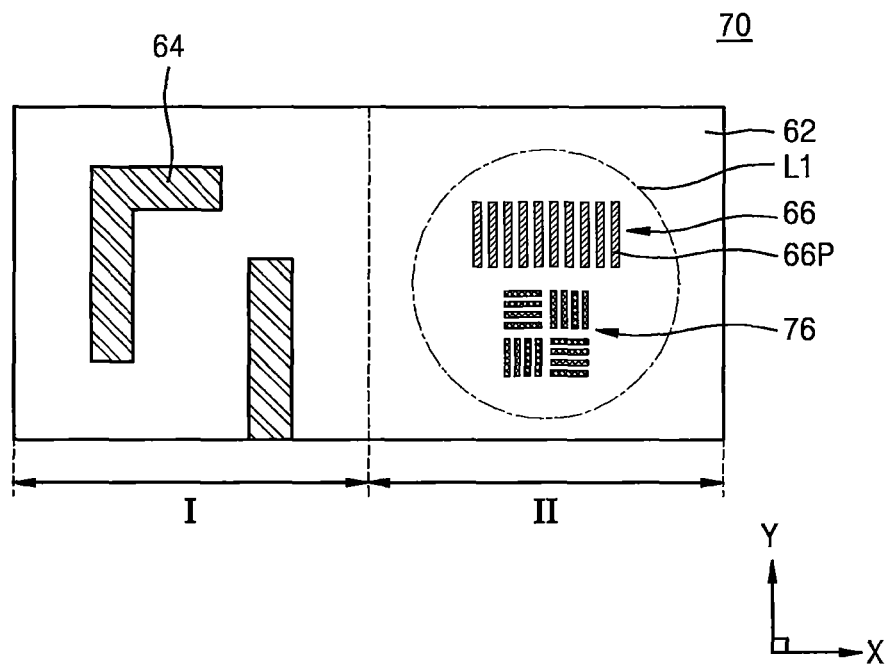
FIG. 10 is a plan view of a substrate target for lithography metrology according to other embodiments of the inventive concepts.

FIG. 10 is a plan view of a substrate target 70 for lithography metrology according to other embodiments of the inventive concepts.

The substrate target 70 is almost the same as the substrate target 60 of FIGS. 9A and 9B except that a micro diffraction based overlay (DBO) key 76 is further formed on the second region II.

The micro-DBO key 76 may be formed simultaneously when the feature patterns 64 are formed on the first region I. In some embodiments, the micro-DBO key 76 may be the overlay pattern 40 transferred from the photomask 10 of FIG. 1.

The focus metrology mark 66 and the micro-DBO key 76 may be formed within the one-time measurement spot L1 formed by one shot of a radiation beam generated by a lithography metrology apparatus for measuring a focal variation of the plurality of feature patterns 64.

FIGS. 11-15 illustrate various focus metrology marks each including a plurality of metrology patterns having different amounts of shift according to defocus that various shapes of substrate targets for lithography metrology have experienced during an exposure process when the various shapes of substrate targets are formed by forming a negative tone photoresist layer on a substrate, such as, a wafer, performing the exposure process on the substrate having the photoresist layer by using a photomask according to some embodiments of the inventive concepts in an exposure apparatus, and developing the exposed photoresist layer.

When the substrate targets for lithography metrology including the focus metrology marks illustrated in FIGS. 11-15 are formed, the exposure apparatus 100 of FIG. 7 may be used to perform the exposure process, but, embodiments of the inventive concepts are not limited thereto.

Figure 11:
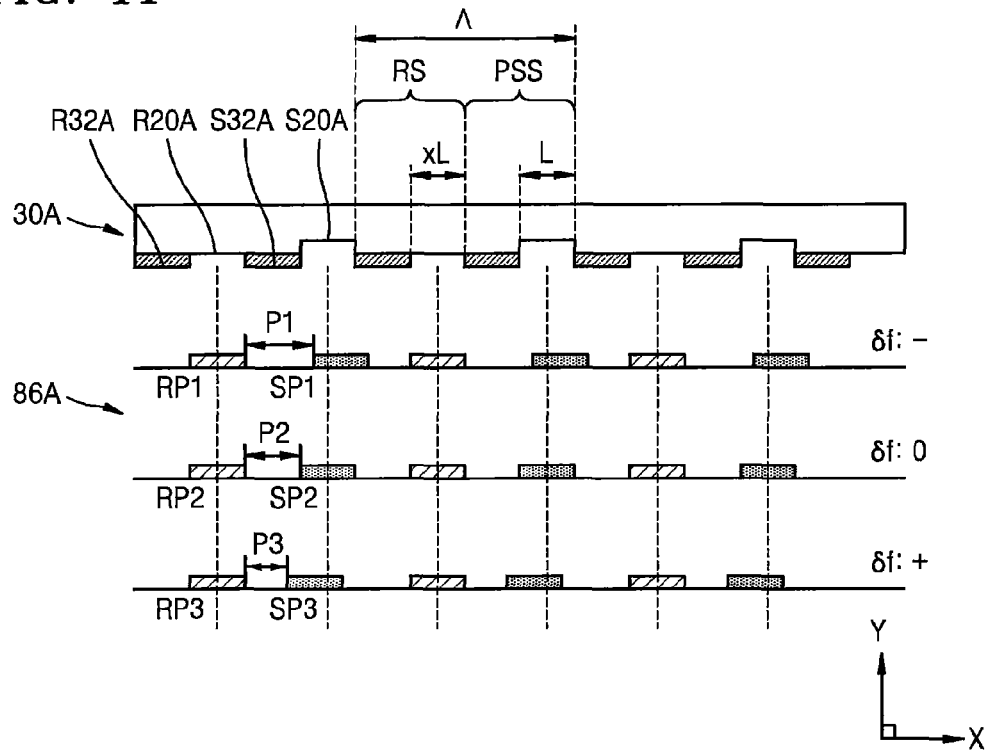
FIGS. 11-15 illustrate various focus metrology marks each including a plurality of metrology patterns having different amounts of shift according to defocus that a substrate target for lithography metrology has experienced during an exposure process when the substrate target is formed by using a photomask according to some embodiments of the inventive concepts.

FIG. 11 illustrates relative distances P1, P2, and P3 between reference patterns RP1, RP2, and RP3 and shift patterns SP1, SP2, and SP3 of a focus metrology mark 86A when a width xL (where x=1) of a reference light-transmissive region R20A and a width L of a shift light-transmissive region 520A are equal to each other in the focus metrology mark region 30A of FIG. 2 and the reference patterns RP1, RP2, and RP3 and the shift patterns SP1, SP2, and SP3 of the focus metrology mark 86A are formed on a substrate target via a reference section RS and a phase shift section PSS of the focus metrology mark region 30A.

In some embodiments, the reference patterns RP1, RP2, and RP3 and the shift patterns SP1, SP2, and SP3 may constitute or define the plurality of metrology patterns 66P of FIGS. 9 and 10.

In some embodiments, a ratio between the width xL of the reference light-transmissive region R20A and the width L of the shift light-transmissive region S20A of the focus metrology mark region 30A may be set to vary. For example, the width xL of the reference light-transmissive region R20A may be equal to or different from the width L of the shift light-transmissive region S20A. In some embodiments, the width xL of the reference light-transmissive region R20A may be about 1 to 10 times the width L of the shift light-transmissive region S20A. In other embodiments, the width xL of the reference light-transmissive region R20A may be smaller than the width L of the shift light-transmissive region S20A.

Since the pattern pitch Λ of the focus metrology mark region 30A includes a reference section RS of one cycle and a phase shift section PSS of one cycle, one reference light-transmissive region R20A and one shift light-transmissive region S20A may alternate with each other within the pattern pitch Λ. In this case, the pattern pitch Λ may be selected from the range of about 200 to 3000 nm.

In the example of FIG. 11, the reference section RS of one cycle included in the pattern pitch Λ may form a single reference pattern group, and the phase shift section PSS of one cycle may form a single shift pattern group.

Figure 12:
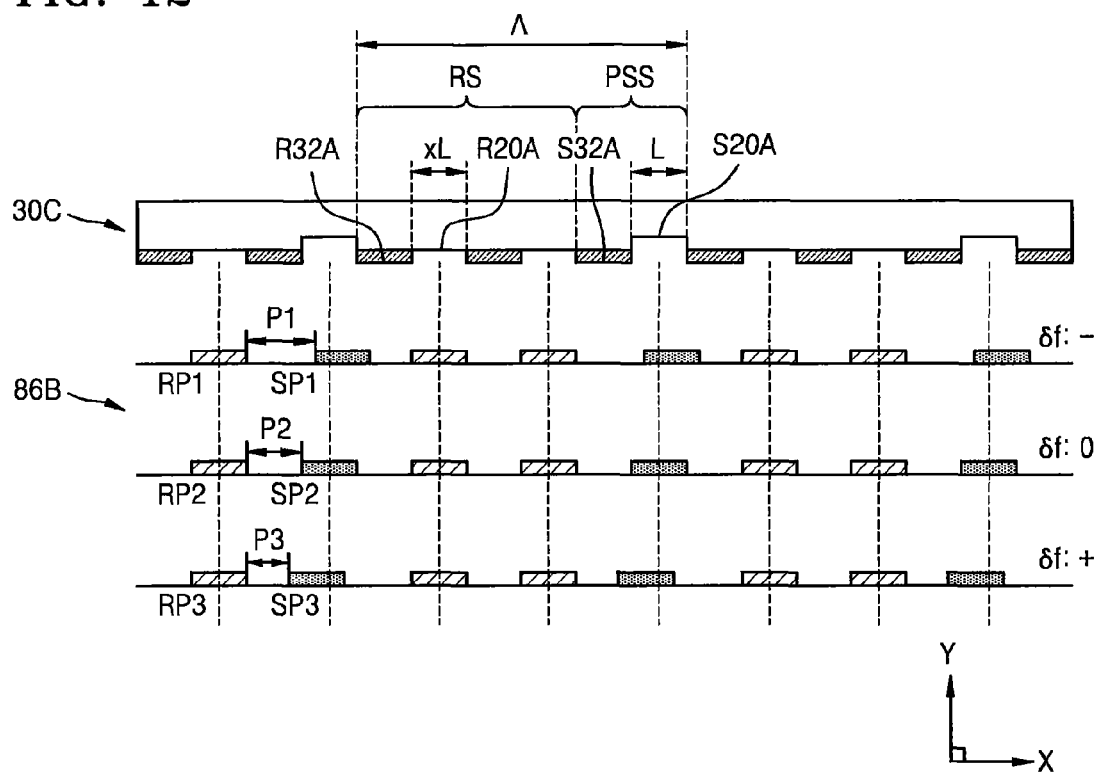

FIG. 12 illustrates relative distances P1, P2, and P3 between reference patterns RP1, RP2, and RP3 and shift patterns SP1, SP2, and SP3 of a focus metrology mark 86B, when a width xL (where x=1) of a reference light-transmissive region R20A and a width L of a shift light-transmissive region S20A are equal to each other in the focus metrology mark region 30C of FIG. 4A and the reference patterns RP1, RP2, and RP3 and the shift patterns SP1, SP2, and SP3 of the focus metrology mark 86B are formed on a substrate target via a reference section RS and a phase shift section PSS of the focus metrology mark region 30C.

In some embodiments, a ratio between the width xL of the reference light-transmissive region R20A and the width L of the shift light-transmissive region S20A of the focus metrology mark region 30C may be set to vary. For example, the width xL of the reference light-transmissive region R20A may be equal to or different from the width L of the shift light-transmissive region S20A. In some embodiments, the width xL of the reference light-transmissive region R20A may be about 1 to 10 times the width L of the shift light-transmissive region S20A. In other embodiments, the width xL of the reference light-transmissive region R20A may be smaller than the width L of the shift light-transmissive region S20A.

The pattern pitch Λ of the focus metrology mark region 30C includes reference sections RS of two cycles and a phase shift section PSS of one cycle. In this case, the pattern pitch Λ may be selected from the range of about 200 to about 3000 nm.

In the example of FIG. 12, the reference sections RS of two cycles included in the pattern pitch Λ may form a single reference pattern group, and the phase shift section PSS of one cycle may form a single shift pattern group.

Figure 13:
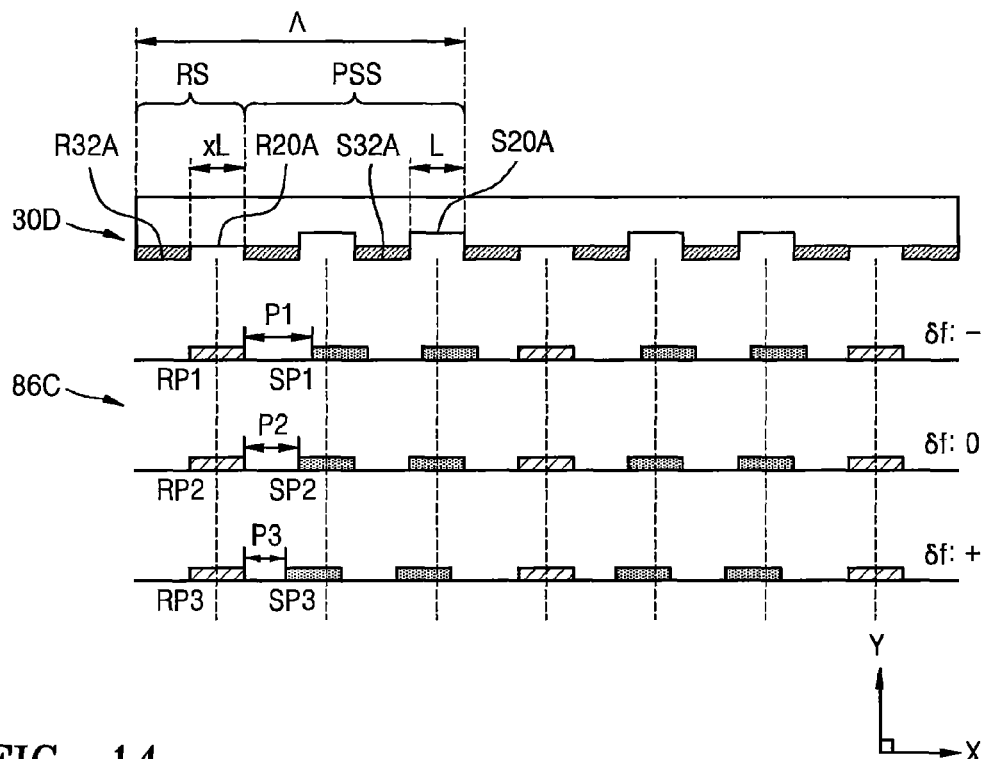

FIG. 13 illustrates relative distances P1, P2, and P3 between reference patterns RP1, RP2, and RP3 and shift patterns SP1, SP2, and SP3 of a focus metrology mark 86C, when a width xL (where x=1) of a reference light-transmissive region R20A and a width L of a shift light-transmissive region S20A are equal to each other in the focus metrology mark region 30D of FIG. 4B and the reference patterns RP1, RP2, and RP3 and the shift patterns SP1, SP2, and SP3 of the focus metrology mark 86C are formed on a substrate target via a reference section RS and a phase shift section PSS of the focus metrology mark region 30D.

In some embodiments, a ratio between the width xL of the reference light-transmissive region R20A and the width L of the shift light-transmissive region S20A of the focus metrology mark region 30D may be set to vary. For example, the width xL of the reference light-transmissive region R20A may be equal to or different from the width L of the shift light-transmissive region S20A. In some embodiments, the width xL of the reference light-transmissive region R20A may be about 1 to 10 times the width L of the shift light-transmissive region S20A. In other embodiments, the width xL of the reference light-transmissive region R20A may be smaller than the width L of the shift light-transmissive region S20A.

The pattern pitch Λ of the focus metrology mark region 30D includes a reference section RS of one cycle and phase shift sections PSS of two cycles. In this case, the pattern pitch Λ may be selected from the range of about 200 to about 3000 nm.

In the example of FIG. 13, the reference section RS of one cycle included in the pattern pitch Λ may form a single reference pattern group, and the phase shift sections PSS of two cycles may form a single shift pattern group.

Figure 14:
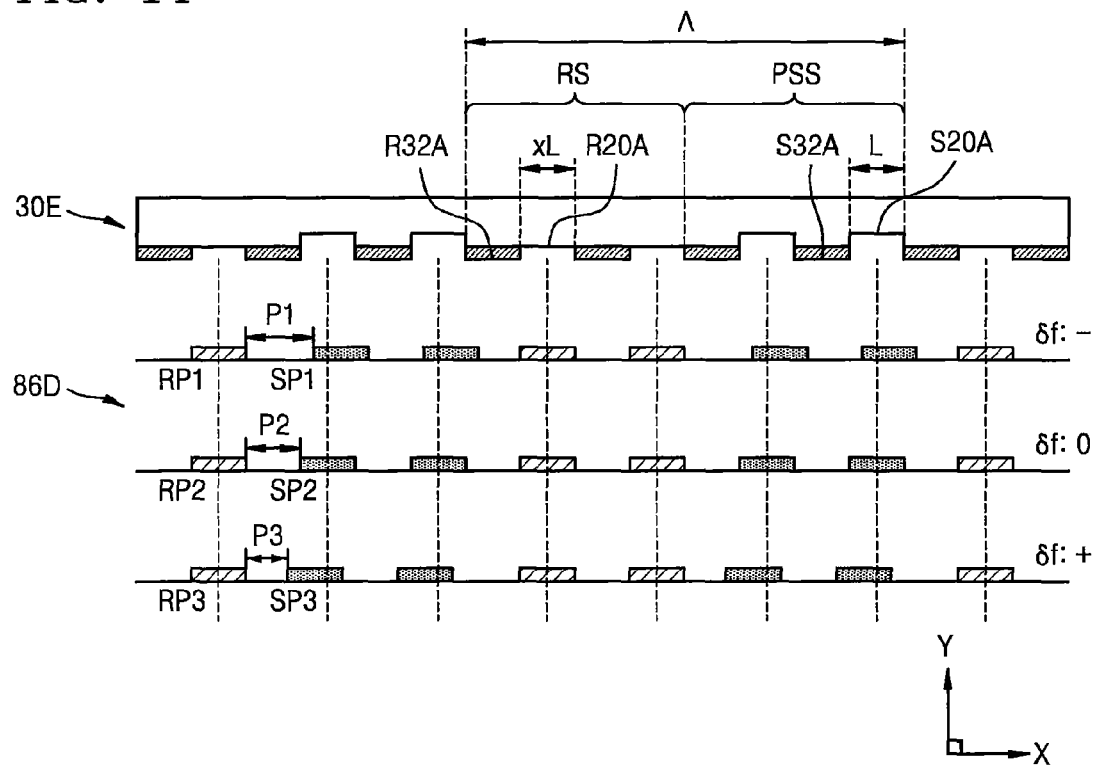

FIG. 14 illustrates relative distances P1, P2, and P3 between reference patterns RP1, RP2, and RP3 and shift patterns SP1, SP2, and SP3 of a focus metrology mark 86D, when a width xL (where x=1) of a reference light-transmissive region R20A and a width L of a shift light-transmissive region S20A are equal to each other in the focus metrology mark region 30E of FIG. 4C and the reference patterns RP1, RP2, and RP3 and the shift patterns SP1, SP2, and SP3 of the focus metrology mark 86D are formed on a substrate target via a reference section RS and a phase shift section PSS of the focus metrology mark region 30E.

In some embodiments, a ratio between the width xL of the reference light-transmissive region R20A and the width L of the shift light-transmissive region S20A of the focus metrology mark region 30E may be set to vary. For example, the width xL of the reference light-transmissive region R20A may be equal to or different from the width L of the shift light-transmissive region S20A. In some embodiments, the width xL of the reference light-transmissive region R20A may be about 1 to 10 times the width L of the shift light-transmissive region S20A. In other embodiments, the width xL of the reference light-transmissive region R20A may be smaller than the width L of the shift light-transmissive region S20A.

The pattern pitch Λ of the focus metrology mark region 30E includes reference sections RS of two cycles and phase shift sections PSS of two cycles. In this case, the pattern pitch Λ may be selected from the range of about 200 to about 3000 nm.

In the example of FIG. 14, the reference sections RS of two cycles included in the pattern pitch Λ may form a single reference pattern group, and the phase shift sections PSS of two cycles included therein may form a single shift pattern group.

Figure 15:
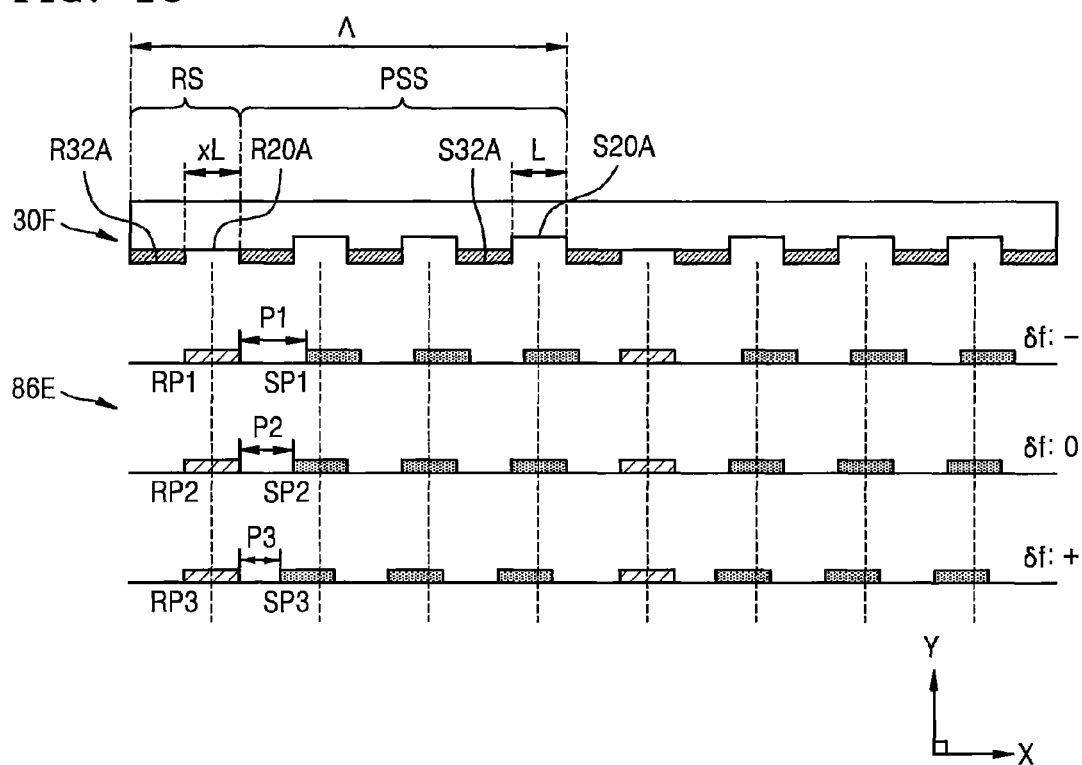

FIG. 15 illustrates relative distances P1, P2, and P3 between reference patterns RP1, RP2, and RP3 and shift patterns SP1, SP2, and SP3 of a focus metrology mark 86E when a width xL (where x=1) of a reference light-transmissive region R20A and a width L of a shift light-transmissive region S20A are equal to each other in the focus metrology mark region 30F of FIG. 4D and the reference patterns RP1, RP2, and RP3 and the shift patterns SP1, SP2, and SP3 are formed on a substrate target via a reference section RS and a phase shift section PSS of the focus metrology mark region 30F.

In some embodiments, a ratio between the width xL of the reference light-transmissive region R20A and the width L of the shift light-transmissive region S20A of the focus metrology mark region 30F may be set to vary. For example, the width xL of the reference light-transmissive region R20A may be equal to or different from the width L of the shift light-transmissive region S20A. In some embodiments, the width xL of the reference light-transmissive region R20A may be about 1 to 10 times the width L of the shift light-transmissive region S20A. In other embodiments, the width xL of the reference light-transmissive region R20A may be smaller than the width L of the shift light-transmissive region S20A.

The pattern pitch Λ of the focus metrology mark region 30F includes a reference section RS of one cycle and phase shift sections PSS of three cycles. In this case, the pattern pitch Λ may be selected from the range of about 200 to about 3000 nm.

In the example of FIG. 15, the reference section RS of one cycle included in the pattern pitch Λ may form a single reference pattern group, and the phase shift sections PSS of three cycles included therein may form a single shift pattern group.

FIG. 16 is a schematic diagram showing a structure of a lithography metrology apparatus 200 according to embodiments of the inventive concepts.

Referring to FIG. 16, the lithography metrology apparatus 200 inspects process parameters that are applied during an exposure process, or process errors such as focal variations and overlay errors, in a non-destructive manner. The lithography metrology apparatus 200 is a diffraction-based in-line metrology device which is a sort of scatterometer and transmits a radiation beam towards the surface of a to-be-measured substrate, such as, a wafer used to manufacture an IC device, and measures in real time the characteristics of a beam diffracted or reflected by the surface of the substrate.

The lithography metrology apparatus 200 includes a stage 210 configured to support a to-be-measured substrate 202, an illumination device 220 configured to generate a radiation beam RB, a projection device 230 for projecting the radiation beam RB generated by the illumination device 220 onto the to-be-measured substrate 202, and a detection device 240 for detecting the characteristics of a beam reflected or diffracted by the to-be-measured substrate 202.

In some embodiments, the to-be-measured substrate 202 may be the substrate target 60 for lithography metrology including the focus metrology mark 66 of FIGS. 9A and 9B or the substrate target 70 for lithography metrology including the focus metrology mark 66 and the micro-DBO key 76 of FIG. 10, after the exposure process described herein. In other embodiments, the to-be-measured substrate 202 may be a substrate target including at least one of the focus metrology marks 86A, 86B, 86C, 86D, and 86E of FIGS. 11-15 and various modifications of the focus metrology marks 86A, 86B, 86C, 86D, and 86E of FIGS. 11-15 that are within the scope of the inventive concepts.

The radiation beam RB generated by the illumination device 220 is incident on the to-be-measured substrate 202 via the projection device 230, which includes a beam splitter 232, an objective lens 234, and a polarizer 236. The polarizer 236 may be configured to polarize the radiation beam RB generated by the illumination device 220 so that the radiation beam RB may be incident on the focus metrology mark 66, 86A, 86B, 86C, 86D, or 86E (see FIGS. 9A-15) formed on the to-be-measured substrate 202. The illumination device 220 may generate a radiation beam having a wavelength of about 230 to about 850 nm.

The projection device 230 may project the radiation beam towards the to-be-measured substrate 202 in a direction (Z direction of FIG. 16) perpendicular to a direction (X or Y direction of FIG. 16) in which the to-be-measured substrate 202 extends.

In some embodiments, the projection device 230 may be configured to project light generated by the illumination device 220 and polarized by the polarizer 236 towards the to-be-measured substrate 202 when the to-be-measured substrate 202 does not move. For example, the projection device 230 may project at least two types of radiation beams as the radiation beam RB. The at least two types of radiation beams may include two types of radiation beams having different wavelengths that are simultaneously incident on an identical location on the to-be-measured substrate 202. In another example, the at least two types of radiation beams may include two types of radiation beams that are sequentially incident on an identical location on the to-be-measured substrate 202. The two types of radiation beams that are sequentially incident may have identical wavelengths or different wavelengths.

An output beam emitted by the to-be-measured substrate 202 may be transmitted to the detection device 240 via the beam splitter 232 and a relay lens 238.

The detection device 240 includes a first detection unit 242 configured to detect the powers of ±n-order diffracted light beams (where n is an integer equal to or greater than 1). The ±n-order diffracted light beams of a same non-zero diffraction order (e.g., first-order (±1), second order (±2), etc.) are diffracted at an identical angle to be symmetrical with each other about a zero-order diffracted light beam from among output beams diffracted by the focus metrology mark 66, 86A, 86B, 86C, 86D, or 86E (see FIGS. 9A-15), which is formed on the to-be-measured substrate 202 by using a lithographic process in, for example, the exposure apparatus 100 of FIG. 7. In some embodiments, the ±n-order diffracted light beams may be, but is not limited to, ±1-order, ±2-order, or ±3-order diffracted light beams.

The lithography metrology apparatus 200 further includes a data storage 250. The data storage 250 includes a first storage medium 252 configured to store first data D1 about defocus that is determined to have been experienced by the to-be-measured substrate 202 during an exposure process, based on the powers of the ±n-order diffracted light beams detected by the first detection unit 242.

The first data D1 about the defocus may be data calculated based on a relative distance between at least one selected from a plurality of reference pattern groups and at least one selected from a plurality of shift pattern groups. The plurality of reference pattern groups and the plurality of shift pattern groups constitute or define the focus metrology mark 66, 86A, 86B, 86C, 86D, or 86E (see FIGS. 9A-15).

The first data D1 stored in the data storage 250 may be transmitted to the determination device 260. The determination device 260 includes a first determination unit 262 which determines defocus that a plurality of metrology patterns of the to-be-measured substrate 202 have experienced when being formed in the exposure apparatus 100, based on the first data D1 obtained from a power deviation between the ±n-order diffracted light beams that has been detected by the first detection unit 242.

The lithography metrology apparatus 200 may further include a control device 270 which calculates compensated focus data based on the defocus inferred by the determination device 260.

The data storage 250 may further include a second storage medium 254 configured to store second data D2 including a depth of focus (DOF), which is the tolerance of defocus that is determined to have been experienced by the to-be-measured substrate 202 during an exposure process.

The determination device 260 may further include a second determination unit 264. The second determination unit 264 determines whether the defocus that is determined to have been experienced by the to-be-measured substrate 202 during an exposure process is within a preset DOF range, and transmits a rework command for the to-be-measured substrate 202 to the control device 270 when the defocus deviates from the preset DOF range.

When the to-be-measured substrate 202 is a substrate target for lithography metrology formed via an exposure process in which the photomask 10 including both the focus metrology mark region 30 and the overlay key pattern 40 as illustrated in FIG. 1 is used, the to-be-measured substrate 202 may further include the micro-DBO key 76 formed simultaneously with the plurality of feature patterns 64, like the substrate target 70 of FIG. 10. The detection device 240 may further include a second detection unit 244 configured to detect the powers of ±n-order diffracted light beams (where n is an integer equal to or greater than 1) diffracted at an identical angle so as to be symmetrical with each other about a zero-order diffracted light beam from among output beams diffracted by the micro-DBO key 76. In this case, the focus metrology mark 66 and the micro-DBO key 76 may be formed on locations within a one-time measurement spot formed by one shot of a radiation beam incident on the to-be-measured substrate 202 via the projection device 230 of the lithography metrology apparatus 200 of FIG. 16.

The determination device 260 may further include a second determination unit 264 which infers an overlay error of a plurality of feature patterns, for example, the plurality of feature patterns 64 of FIGS. 9A and 9B, from a power deviation between the ±n-order diffracted light beams from the output beams diffracted by the micro-DBO key 76 that is detected by the second detection unit 244. In some embodiments, the second determination unit 264 may infer the overlay error of the plurality of feature patterns 64 from a power deviation between ±1-order diffracted light beams that has been detected by the second detection unit 244.

In some embodiments, to measure a focal variation from a focus metrology mark, for example, the focus metrology mark 66 of FIG. 10, on the to-be-measured substrate 202 and measure an overlay error from a micro-DBO key, for example, the micro-DBO key 76 of FIG. 10, on the to-be-measured substrate 202, the projection device 230 may be configured to project at least two types of radiation beams polarized by the polarizer 236 towards the to-be-measured substrate 202 when the to-be-measured substrate 202 does not move. In some embodiments, the at least two types of radiation beams may include two types of radiation beams having different wavelengths that are simultaneously incident on an identical location on the to-be-measured substrate 202. In other embodiments, the at least two types of radiation beams may include two types of radiation beams that are sequentially incident on an identical location on the to-be-measured substrate 202. The two types of radiation beams that are sequentially incident may have identical wavelengths or different wavelengths.

Figure 17:
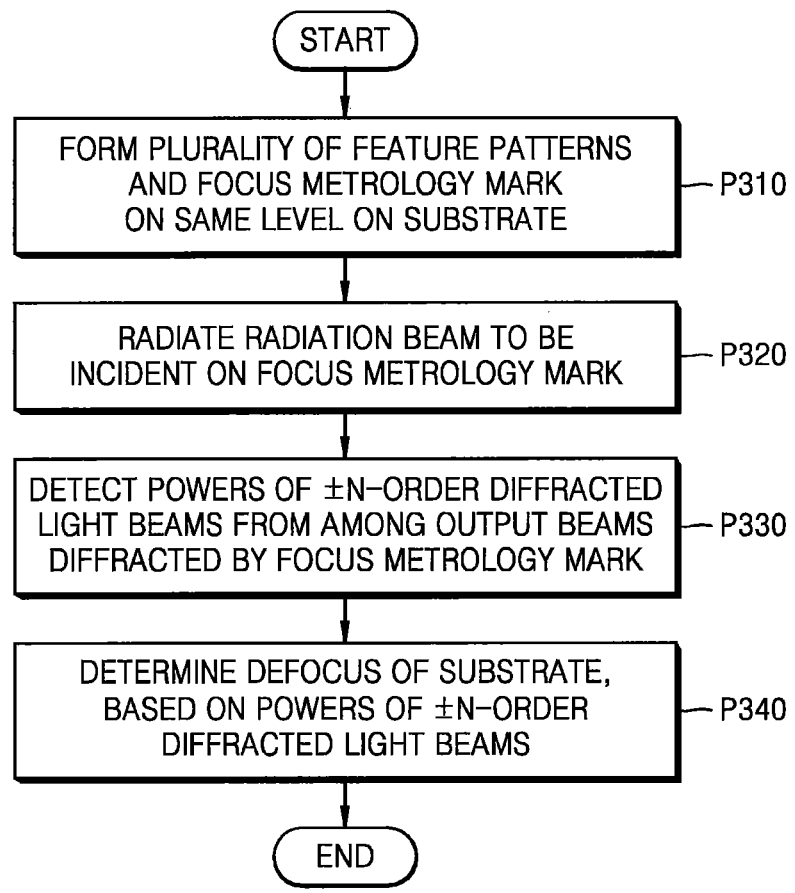
FIG. 17 is a flowchart of a lithography metrology method according to embodiments of the inventive concepts.

FIG. 17 is a flowchart of a lithography metrology method according to embodiments of the inventive concepts. The lithography metrology method of FIG. 17 may be performed using the exposure apparatus 100 of FIG. 7 and the lithography metrology apparatus 200 of FIG. 16, but embodiments of the inventive concepts are not limited thereto. The lithography metrology method of FIG. 17 may be performed using any of various exposure apparatuses and any of various lithography metrology apparatuses.

Referring to FIG. 17, in operation P310, a plurality of feature patterns, and a focus metrology mark including a plurality of metrology patterns spaced apart from each other to measure a focal variation of the plurality of feature patterns are formed on the same level on a substrate via an exposure process.

In some embodiments, the focus metrology mark formed in operation P310 may include at least one of the focus metrology mark 66 and the micro-DBO key 76 of FIGS. 9A-10 and the focus metrology marks 86A, 86B, 86C, 86D, and 86E of FIGS. 11-15.

To form the focus metrology mark, the substrate 62 of FIGS. 9A and 9B may be used. In other words, a photoresist layer is formed on the substrate 62, an exposure process is performed on the photoresist layer by using the exposure apparatus 100 of FIG. 7, and an exposed photoresist layer is developed, thereby forming the plurality of feature patterns 64 on the first region I of the substrate 62 and forming the focus metrology mark 66 including the plurality of metrology patterns 66P on the second region II of the substrate 62. The plurality of feature patterns 64 and the focus metrology mark 66 may be photoresist patterns left on the substrate 62 after the photoresist layer is developed.

In operation P320, a radiation beam is incident on the focus metrology mark 66.

In some embodiments, the radiation beam may be incident on the focus metrology mark 66 by using the projection device 230 of the lithography metrology apparatus 200 of FIG. 16.

In operation P330, the powers of ±n-order diffracted light beams (where n is an integer equal to or greater than 1) of a same non-zero diffraction order, i.e., diffracted at identical angles so as to be symmetrical with each other about a zero-order diffracted light beam from among output beams diffracted by the focus metrology mark, are detected.

In some embodiments, the powers may be detected by using the first detection unit 242 of the lithography metrology apparatus 200 of FIG. 16. First (±1)-order, second (±2)-order, or third (±3)-order diffracted light beams may be detected as the ±n-order diffracted light beams.

In operation P340, defocus that the to-be-measured substrate has experienced during an exposure process is determined based on the powers of the ±n-order diffracted light beams.

In some embodiments, to determine the defocus, the lithography metrology apparatus 200 of FIG. 16 may include the first determination unit 262.

For example, when a substrate target including at least one of the focus metrology marks 86A, 86B, 86C, 86D, and 86E of FIGS. 11-15 is formed in operation P310, the defocus may be determined (or inferred) in operation P340, based on a relative distance between at least one selected from the plurality of reference pattern groups (e.g., a plurality of reference pattern groups respectively including the reference patterns RP1, RP2, and RP3) and at least one selected from the plurality of shift pattern groups (e.g., a plurality of reference pattern groups respectively including the plurality of shift patterns SP1, SP2, and SP3). The plurality of reference pattern groups and the plurality of shift pattern groups are arranged in a first direction, for example, the X direction of each of FIGS. 11-15.

Figure 18:
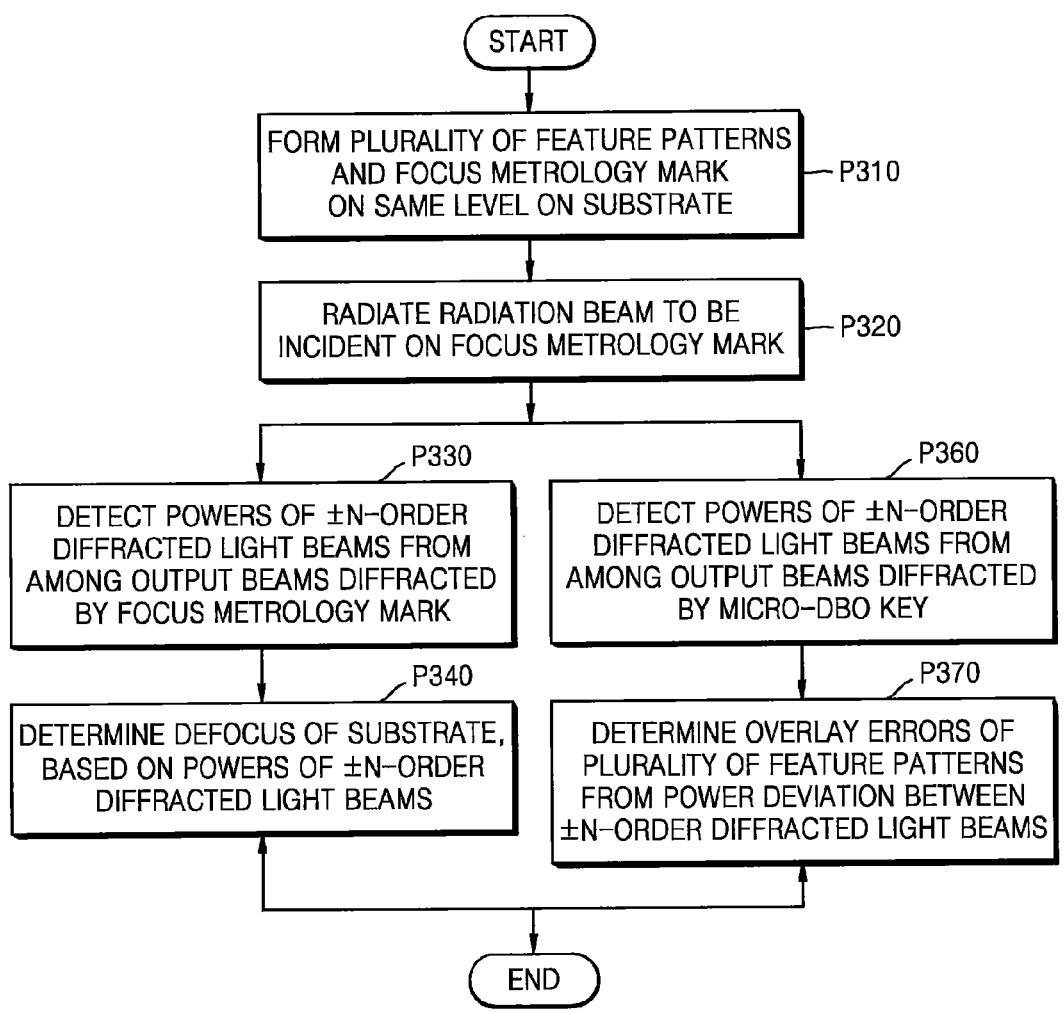
FIG. 18 is a flowchart of a lithography metrology method according to other embodiments of the inventive concepts.

FIG. 18 is a flowchart of a lithography metrology method according to other embodiments of the inventive concepts.

The lithography metrology method of FIG. 18 includes some of the operations described above with reference to FIG. 17, and such operations will not be repeatedly described herein.

Referring to FIG. 18, operations P310 and P320 described above with reference to FIG. 17 are performed.

In particular, when the plurality of feature patterns and the focus metrology mark are formed on the substrate in operation P310, the focus metrology mark 66 and the micro-DBO key 76 may be simultaneously formed on the second region II of the substrate target 70 as illustrated in FIG. 10.

When the radiation beam is incident on the focus metrology mark 66 in operation P320, the radiation beam may be incident on both the focus metrology mark 66 and the micro-DBO key 76. To this end, the focus metrology mark 66 and the micro-DBO key 76 may be disposed at locations included within a one-time measurement spot formed by one shot of a radiation beam incident on the substrate target 70.

In operation P360, the powers of ±n-order diffracted light beams (where n is an integer equal to or greater than 1) of a same non-zero diffraction order, i.e., diffracted at identical angles so as to be symmetrical with each other about a zero-order diffracted light beam from among output beams diffracted by the micro-DBO key 76, are detected.

The operation P360 of detecting the powers of the ±n-order diffracted light beams output by the micro-DBO key 76 and the operation P330 of detecting the powers of the ±n-order diffracted light beams output by the focus metrology mark 66 may be performed simultaneously or sequentially. For example, operation P360 may be performed before or after operation P330.

In operation P370, overlay errors of the plurality of feature patterns are determined from a power deviation between the ±n-order diffracted light beams detected in operation P360.

In some embodiments, the operation P370 of determining the overlay errors and the operation P340 of determining the defocus may be performed simultaneously or sequentially. For example, operation P370 may be performed before or after operation P340.

FIG. 19A-19F are graphs showing diffraction efficiencies during an exposure process that were evaluated according to a relative distance D between a reference pattern and a shift pattern from among a plurality of metrology patterns that constitute or define a focus metrology mark by using a rigorous coupled wave analysis (RCAW) method, when defocus that a feature pattern formed on a to-be-measured substrate has experienced during an exposure process is determined by using the focus metrology mark. The focus metrology mark is formed on the to-be-measured substrate by using a lithography metrology method according to embodiments of the inventive concepts.

Figure 19A:
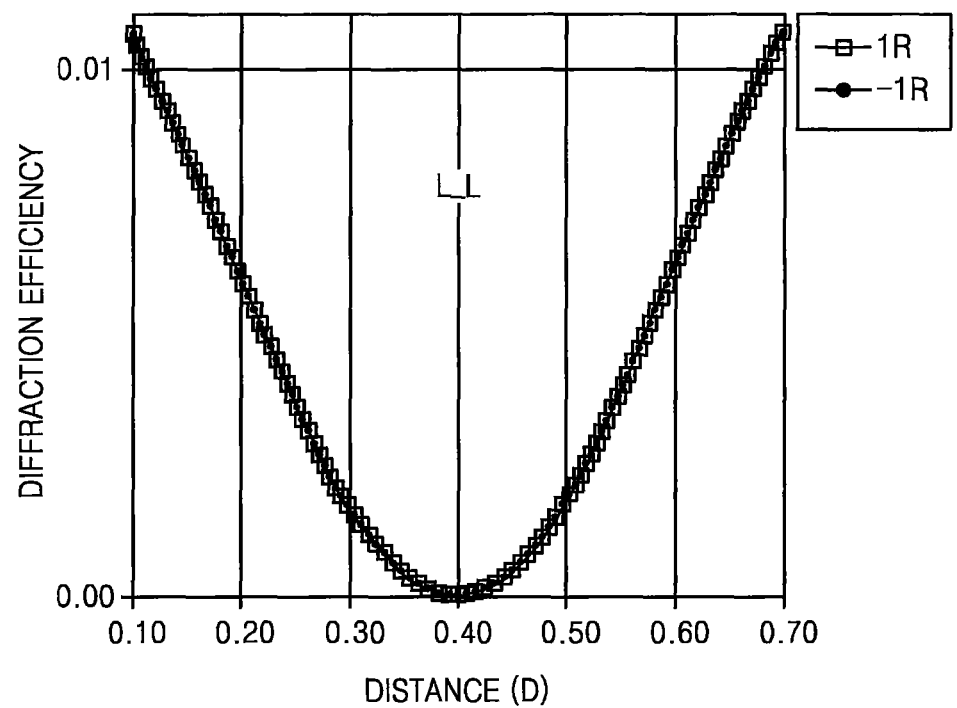
FIG. 19A-19F are graphs showing diffraction efficiencies during an exposure process that were evaluated according to a relative distance between a reference pattern and a shift pattern from among a plurality of metrology patterns that constitute or define a focus metrology mark, when defocus is determined by using a lithography metrology method according to embodiments of the inventive concepts.
Figure 19B:
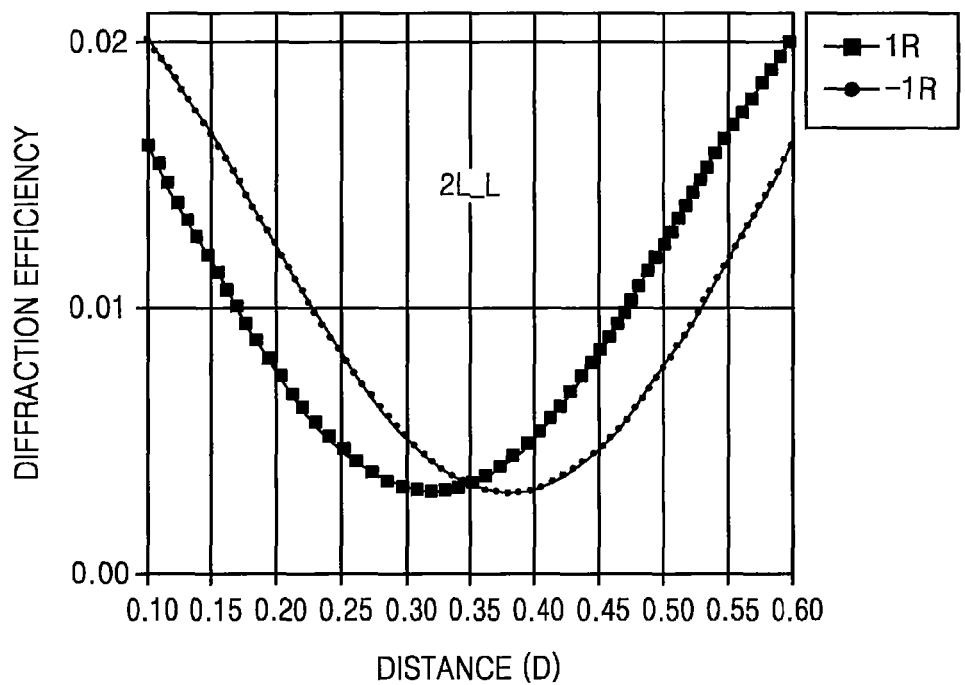
Figure 19C:
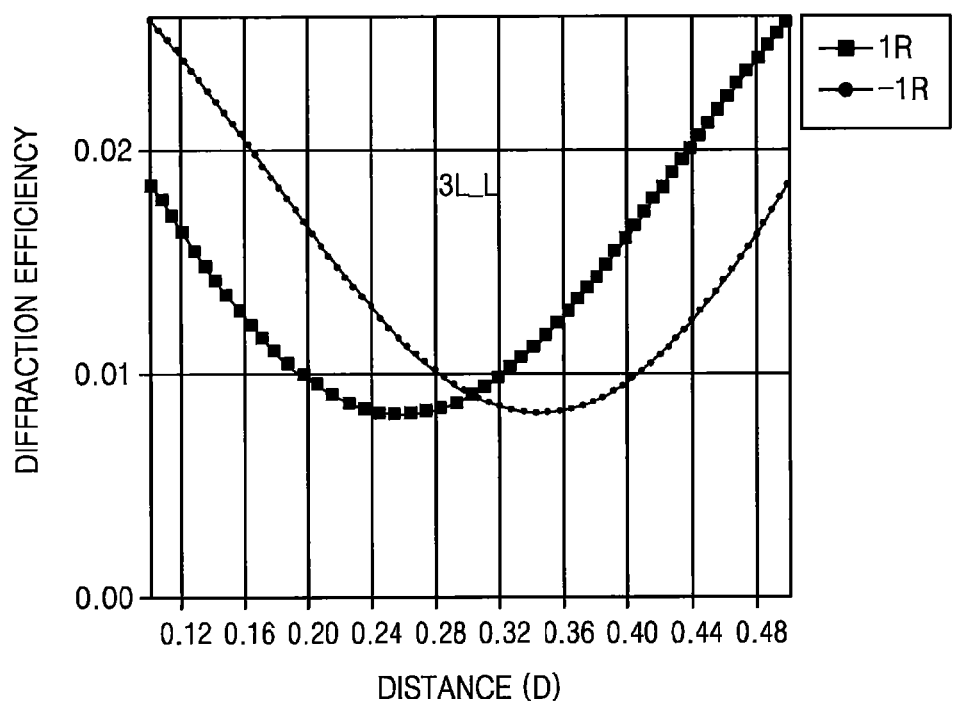
Figure 19D:
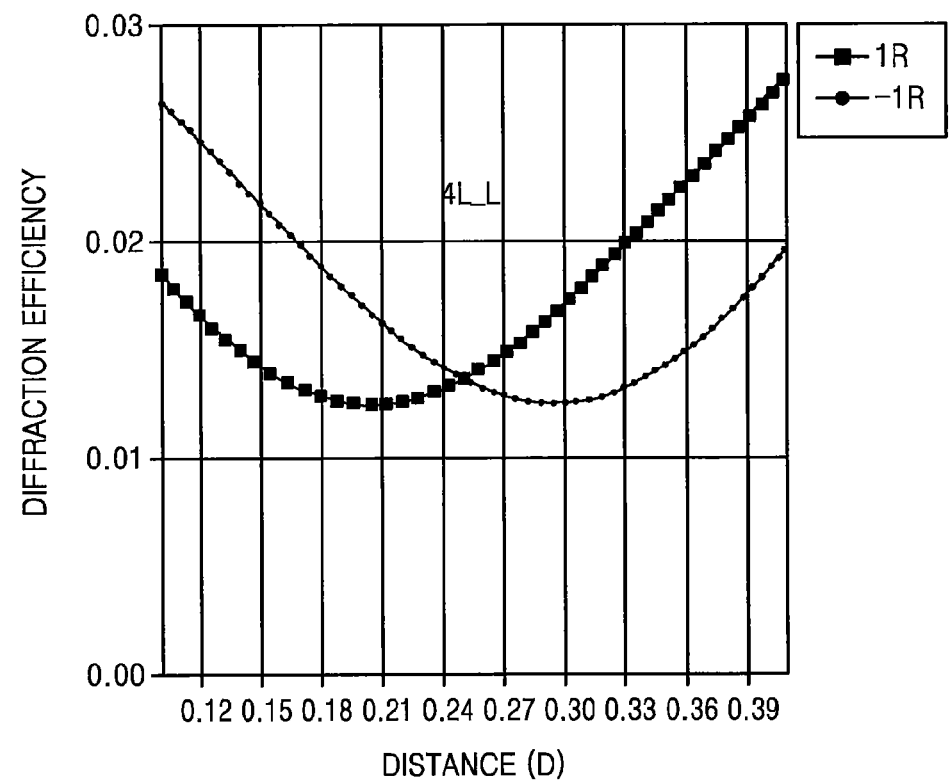
Figure 19E:
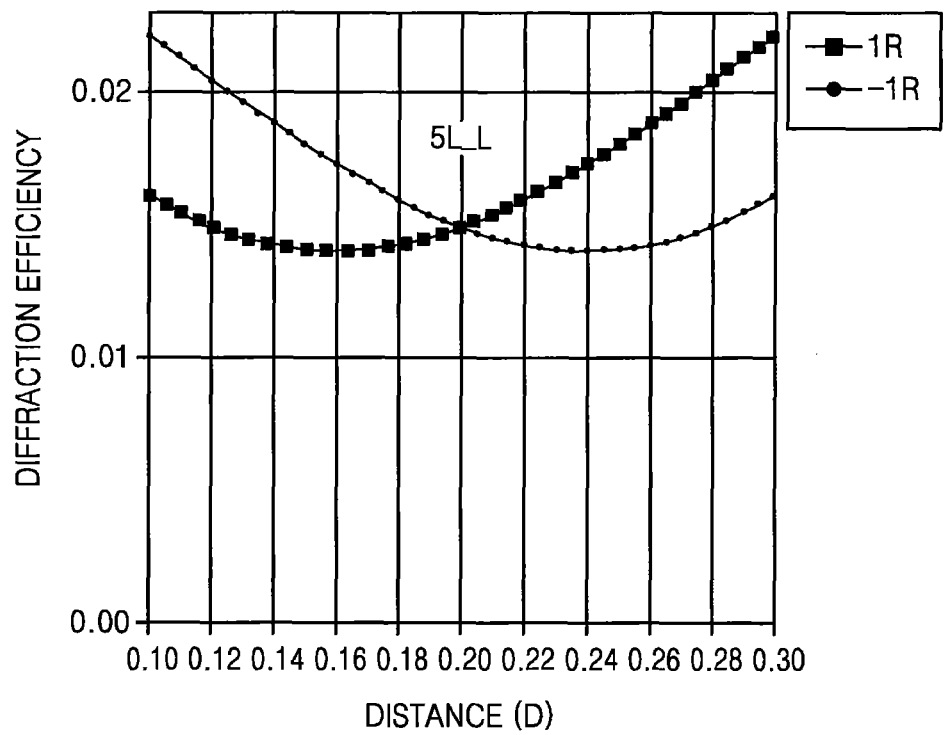
Figure 19F:
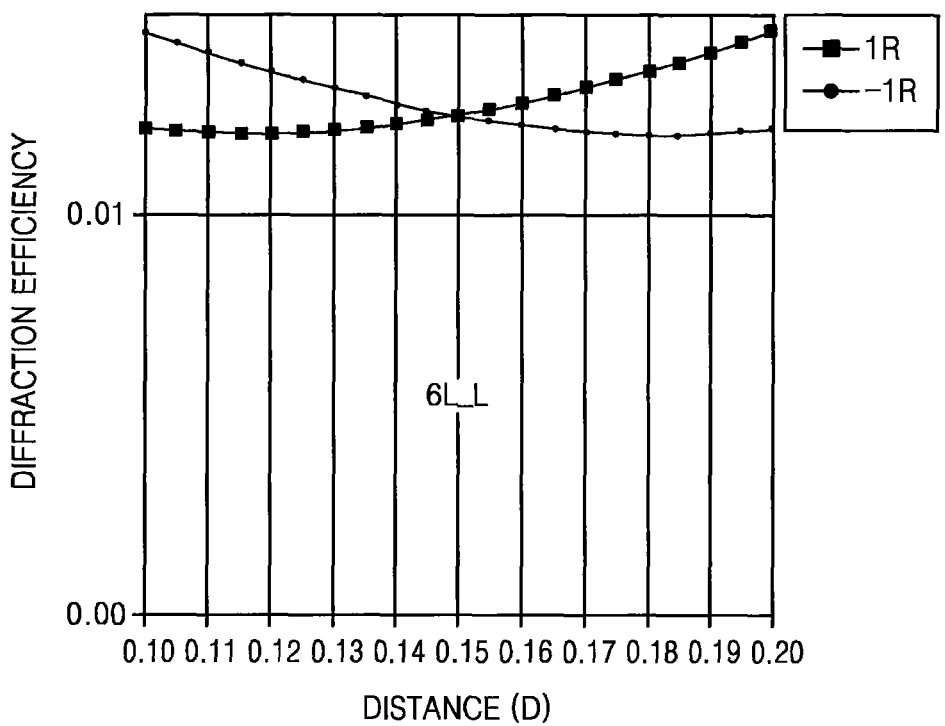

To perform the evaluations of FIGS. 19A-19F, photomask samples in which the focus metrology mark region 30A of FIG. 11 has the pattern pitch Λ fixed to 1000 nm and the width xL of the reference light-transmissive region R20A has any of various sizes that are one to six times the width L of the shift light-transmissive region S20A were formed. In other words, FIG. 19A illustrates a case L_L where the width xL (where x=1) of the reference light-transmissive region R20A of FIG. 11 is equal to the width L of the shift light-transmissive region S20A of FIG. 11. FIG. 19B illustrates a case 2L_L where the width xL (where x=2) of the reference light-transmissive region R20A is twice the width L of the shift light-transmissive region S20A. FIG. 19C illustrates a case 3L_L where the width xL (where x=3) of the reference light-transmissive region R20A is three times the width L of the shift light-transmissive region 520A. FIG. 19D illustrates a case 4L_L where the width xL (where x=4) of the reference light-transmissive region R20A is four times the width L of the shift light-transmissive region S20A. FIG. 19E illustrates a case 5L_L where the width xL (where x=5) of the reference light-transmissive region R20A is five times the width L of the shift light-transmissive region S20A. FIG. 19F illustrates a case 6L_L where the width xL (where x=6) of the reference light-transmissive region R20A is six times the width L of the shift light-transmissive region S20A.

Focus metrology mark samples including reference patterns RP1, RP2, and RP3 and shift patterns SP1, SP2, and SP3 used in the evaluations of FIGS. 19A-19F were formed as follows. First, a hard mask layer, an inorganic antireflection layer, and an organic antireflection layer were sequentially formed on a silicon substrate, a photoresist layer was then formed on the organic antireflection layer, and thereafter an exposure process was performed on the photoresist layer by using the above-described photomask samples. Next, a plurality of focus metrology mark samples having various relative distances P1, P2, and P3 (see FIGS. 11 and 15) were formed via a developing process.

The hard mask layer was formed of a carbon-containing film formed of a spin-on hardmask (SOH) material including an organic compound with a relatively high carbon content of about 85 to about 99% by weight based on the overall weight of the organic compound. The inorganic antireflection layer was formed of SiON. The organic antireflection layer was formed of bottom anti-reflective coating (BARC).

Thereafter, a radiation beam having a wavelength of 633 nm was perpendicularly incident on the plurality of focus metrology mark samples formed on the silicon substrate, and then the powers of ±1-order diffracted light beams from among output beams diffracted by the plurality of focus metrology mark samples were detected, to thereby evaluate diffraction efficiencies during an exposure process according to relative distances D between a reference pattern and a shift pattern.

In FIGS. 19A-19F, a distance D on the horizontal axis represents the relative distances P1, P2, and P3 (see FIGS. 11-15) between the reference patterns RP1, RP2, and RP3 and the shift patterns SP1, SP2, and SP3, "1R" represents a +1-order diffracted light beam, and "−1R" represents a −1-order diffracted light beam.

From the results of the evaluations of FIGS. 19A-19F, it may be known that diffraction efficiency tends to vary in a constant pattern according to the relative distances D between the reference patterns RP1, RP2, and RP3 and the shift patterns SP1, SP2, and SP3, except for the case L_L where the width xL (where x=1) of the reference light-transmissive region R20A of FIG. 11 is equal to the width L of the shift light-transmissive region S20A of FIG. 11 as illustrated in FIG. 19A. Accordingly, a correlation between the relative distances D between the reference patterns RP1, RP2, and RP3 and the shift patterns SP1, SP2, and SP3 defining a focus metrology mark and ±1-order diffracted light beams output by the focus metrology mark may be inferred.

Figure 20:
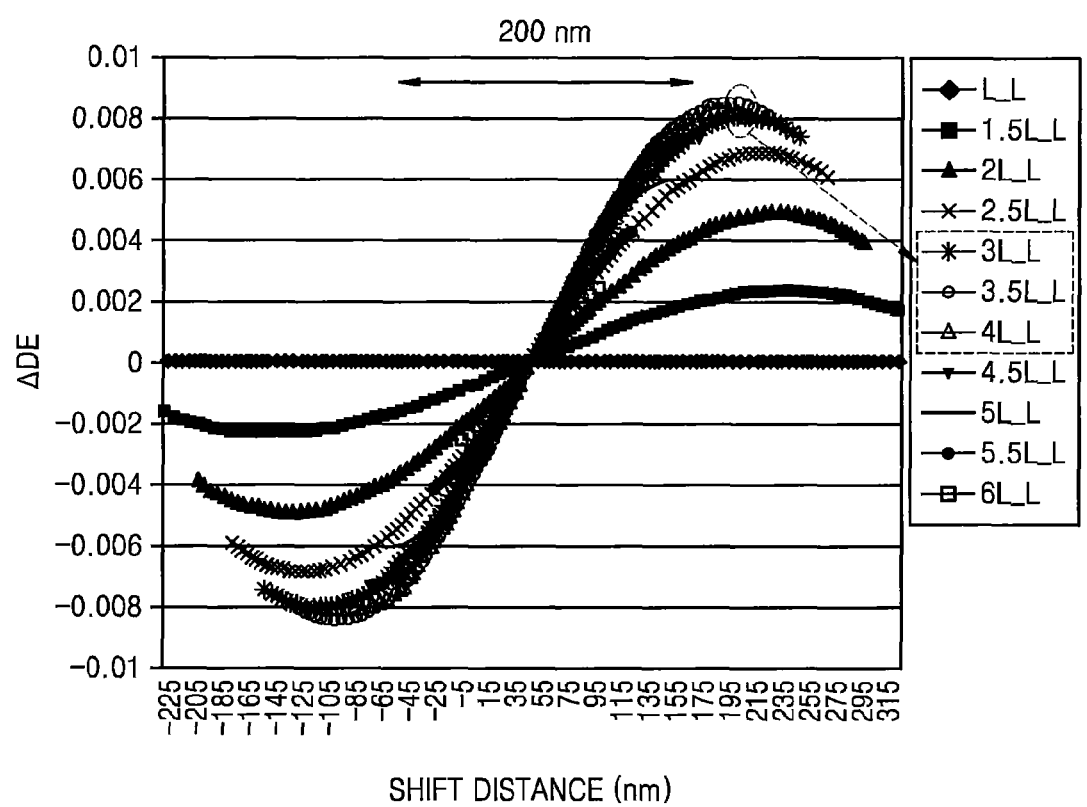
FIGS. 20-24 are graphs each showing a power deviation between diffracted light beams according to a shift distance of a shift pattern, when a focus metrology mark region of a substrate target for lithography metrology according to embodiments of the inventive concepts has various pattern pitches, a reference light-transmissive region thereof has various widths, and a shift light-transmissive region thereof has various widths.

FIG. 20 is a graph showing a power deviation ΔDE between ±1-order diffracted light beams output by a focus metrology mark according to a shift distance between a position of the shift pattern SP2 when defocus is 0 and a position of the shift pattern SP1 or SP3 when defocus is (−) or (+), when the pattern pitch Λ of the focus metrology mark region 30A of FIG. 11 was fixed to 1000 nm and the width xL of the reference light-transmissive region R20A and the width L of the shift light-transmissive region S20A were set to have various values.

In FIG. 20, the power deviation ΔDE between the first (±1)-order diffracted light beams, namely, a difference between the −1-order diffracted light beam and the +1-order diffracted light beam, linearly varies in a shift distance section of at least 200 nm. Accordingly, based on a result of FIG. 20, defocus that has occurred during an exposure process for forming the reference patterns RP1, RP2, and RP3 and the shift patterns SP1, SP2, and SP3 may be inferred from the relative distances between the reference patterns RP1, RP2, and RP3 and the shift patterns SP1, SP2, and SP3.

For example, in the cases enclosed by a dotted line in FIG. 20, namely, the case 3L_L where a ratio between the width xL of the reference light-transmissive region R20A and the width L of the shift light-transmissive region S20A is 3:1, the case 3.5L_L where the ratio between the width xL of the reference light-transmissive region R20A and the width L of the shift light-transmissive region S20A is 3.5:1, and the case 4L_L where the ratio between the width xL of the reference light-transmissive region R20A and the width L of the shift light-transmissive region S20A is 4:1, a slope of the power deviation ΔDE in the shift distance section of at least 200 nm is greater than in the other cases. Thus, a power deviation ΔDE between ±1-order diffracted light beams according to fine variations in a shift distance may be more precisely inferred.

Figure 21:
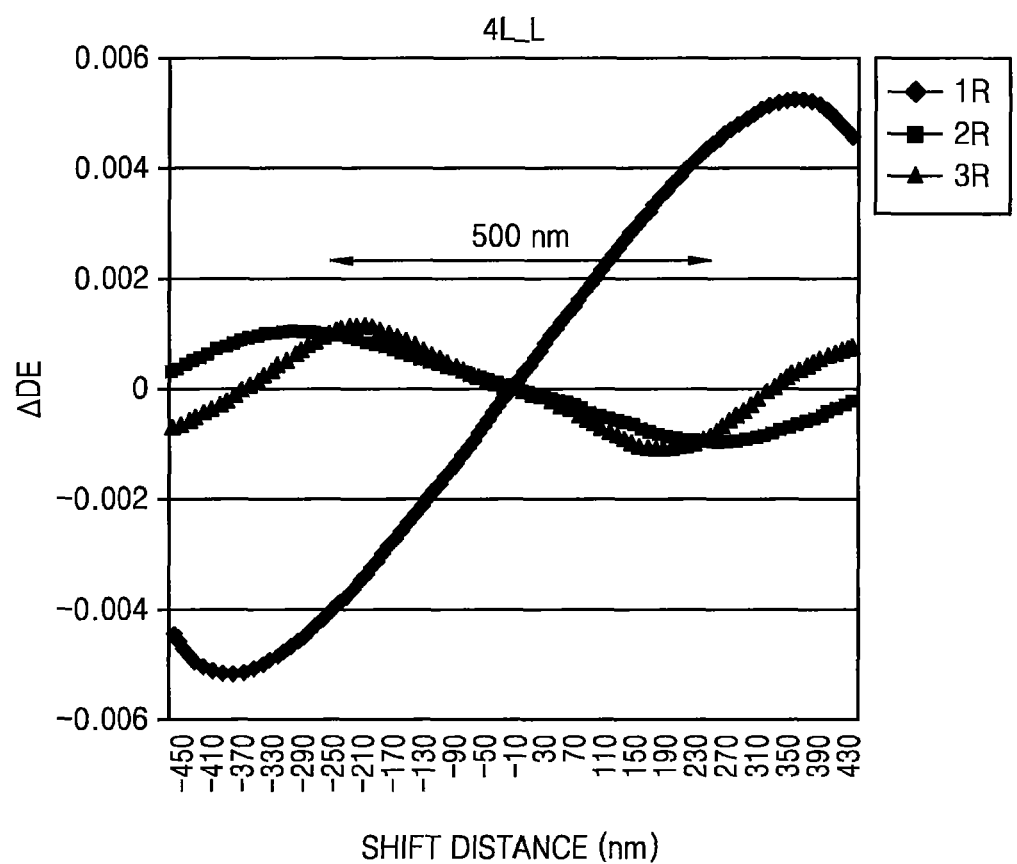

FIG. 21 is a graph showing respective power deviations ΔDE of ±1-order diffracted light beams 1R, ±2-order diffracted light beams 2R, and ±3-order diffracted light beams 3R output by a focus metrology mark according to a shift distance of the shift pattern SP2, when the pattern pitch Λ of the focus metrology mark region 30C of FIG. 12 is 2000 nm and the ratio between the width xL of the reference light-transmissive region R20A and the shift light-transmissive region S20A is 4:1.

In FIG. 21, the respective power deviations ΔDE of the ±1-order diffracted light beams 1R, the ±2-order diffracted light beams 2R, and the ±3-order diffracted light beams 3R linearly vary in a shift distance section of at least 500 nm. Accordingly, based on a result of FIG. 21, defocus that has occurred during an exposure process for forming the reference patterns RP1, RP2, and RP3 and the shift patterns SP1, SP2, and SP3 may be inferred from the relative distances between the reference patterns RP1, RP2, and RP3 and the shift patterns SP1, SP2, and SP3.

Figure 22:
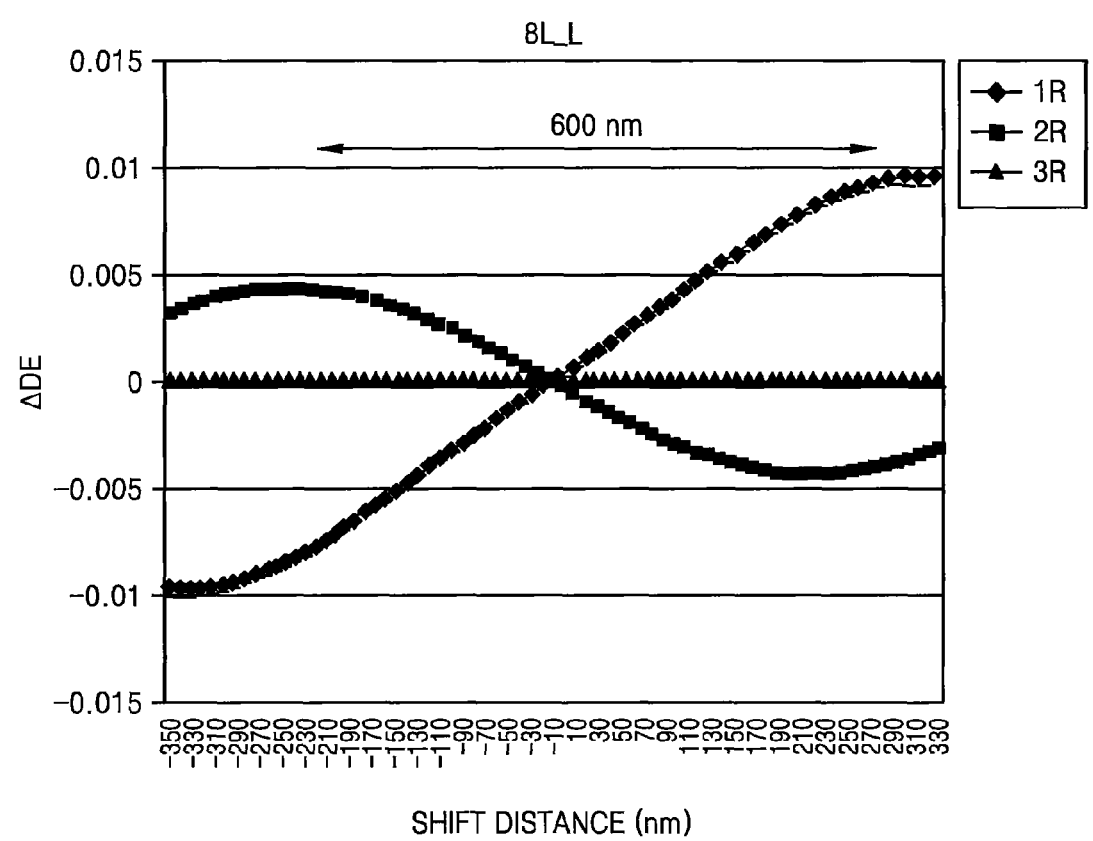

FIG. 22 is a graph showing respective power deviations ΔDE of ±1-order diffracted light beams 1R, ±2-order diffracted light beams 2R, and ±3-order diffracted light beams 3R output by a focus metrology mark according to a shift distance of the shift pattern SP2, when the pattern pitch Λ of the focus metrology mark region 30D of FIG. 13 is 2000 nm and the ratio between the width xL of the reference light-transmissive region R20A and the shift light-transmissive region S20A is 8:1.

In FIG. 22, the respective power deviations ΔDE of the ±1-order diffracted light beams 1R, the ±2-order diffracted light beams 2R, and the ±3-order diffracted light beams 3R linearly vary in a shift distance section of at least 600 nm. Accordingly, based on a result of FIG. 22, defocus that has occurred during an exposure process for forming the reference patterns RP1, RP2, and RP3 and the shift patterns SP1, SP2, and SP3 may be inferred from the relative distances between the reference patterns RP1, RP2, and RP3 and the shift patterns SP1, SP2, and SP3.

Figure 23:
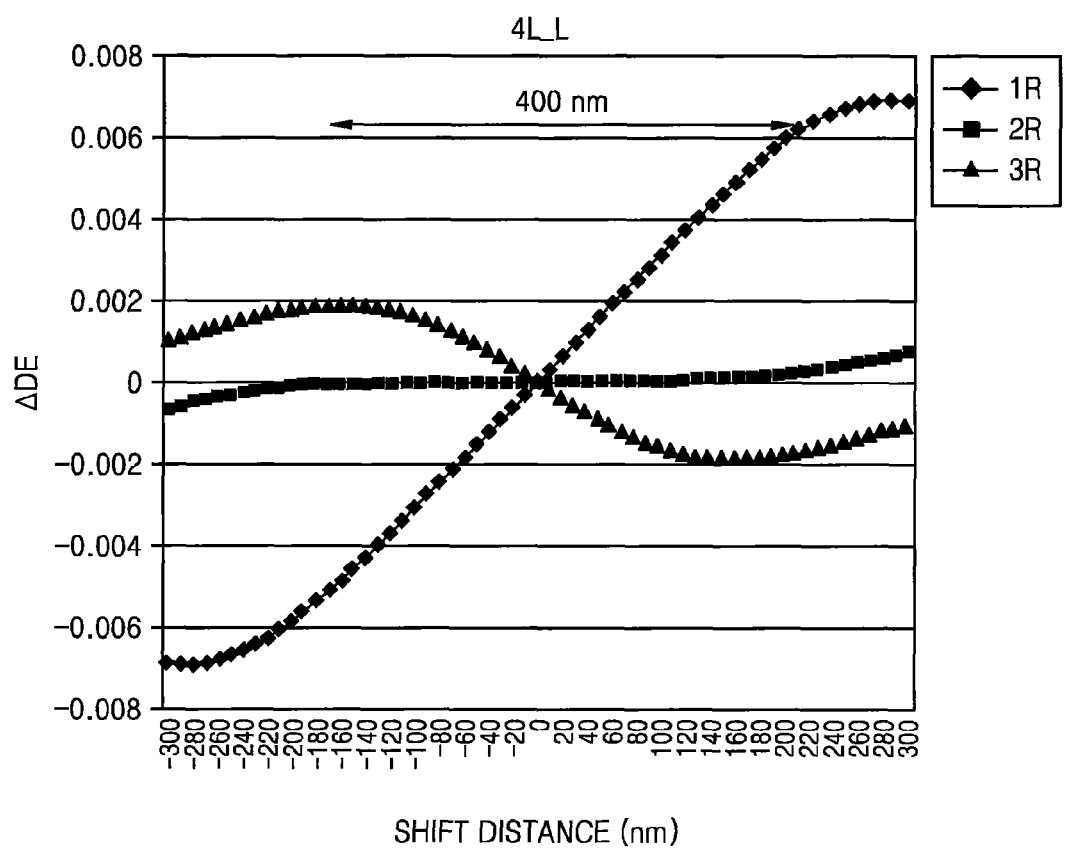

FIG. 23 is a graph showing respective power deviations ΔDE of ±1-order diffracted light beams 1R, ±2-order diffracted light beams 2R, and ±3-order diffracted light beams 3R output by a focus metrology mark according to a shift distance of the shift pattern SP2, when the pattern pitch Λ of the focus metrology mark region 30E of FIG. 14 is 2000 nm and the ratio between the width xL of the reference light-transmissive region R20A and the shift light-transmissive region S20A is 4:1.

In FIG. 23, the respective power deviations ΔDE of the ±1-order diffracted light beams 1R, the ±2-order diffracted light beams 2R, and the ±3-order diffracted light beams 3R linearly vary in a shift distance section of at least 400 nm. Accordingly, based on a result of FIG. 23, defocus that has occurred during an exposure process for forming the reference patterns RP1, RP2, and RP3 and the shift patterns SP1, SP2, and SP3 may be inferred from the relative distances between the reference patterns RP1, RP2, and RP3 and the shift patterns SP1, SP2, and SP3.

Figure 24:
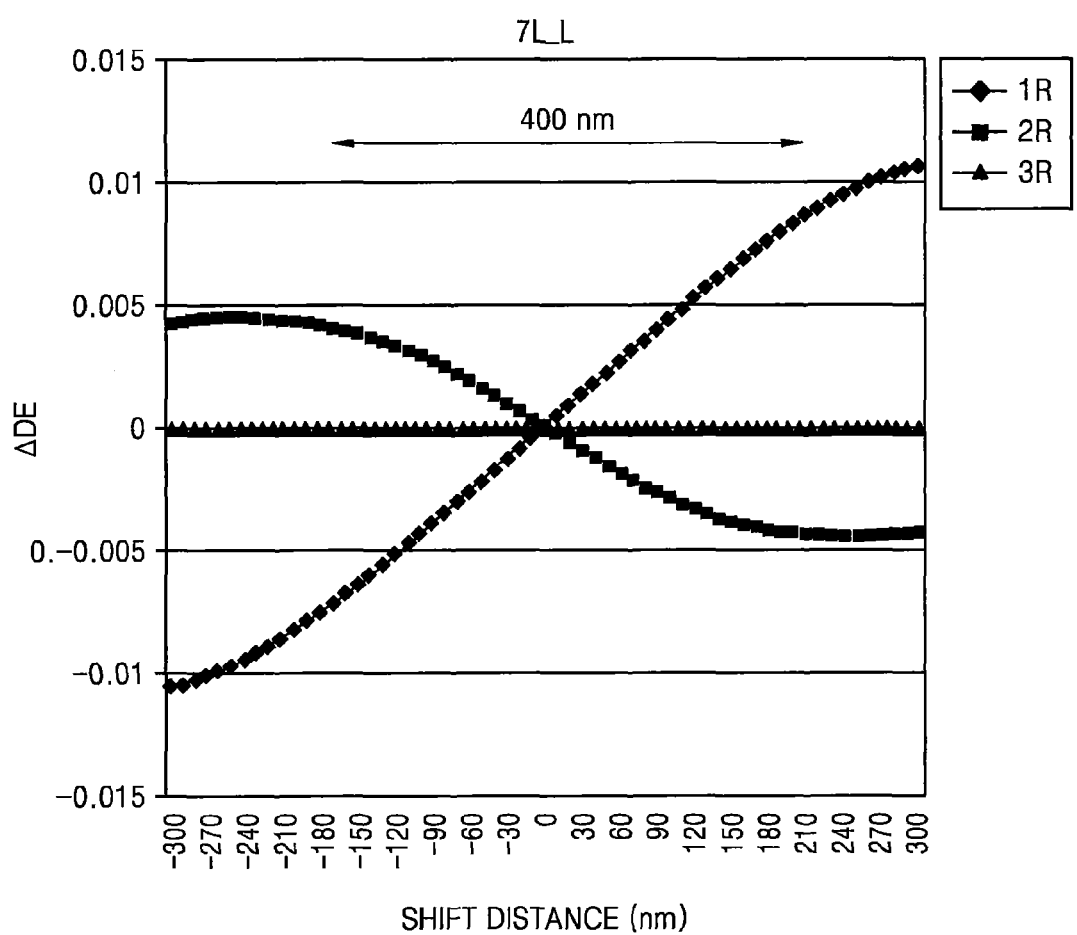

FIG. 24 is a graph showing respective power deviations ΔDE of ±1-order diffracted light beams 1R, ±2-order diffracted light beams 2R, and ±3-order diffracted light beams 3R output by a focus metrology mark according to a shift distance of the shift pattern SP2, when the pattern pitch Λ of the focus metrology mark region 30F of FIG. 15 is 2000 nm and the ratio between the width xL of the reference light-transmissive region R20A and the shift light-transmissive region S20A is 7:1.

In FIG. 24, the respective power deviations ΔDE of the ±1-order diffracted light beams 1R, the ±2-order diffracted light beams 2R, and the ±3-order diffracted light beams 3R linearly vary in a shift distance section of at least 400 nm. Accordingly, based on a result of FIG. 24, defocus that has occurred during an exposure process for forming the reference patterns RP1, RP2, and RP3 and the shift patterns SP1, SP2, and SP3 may be inferred from the relative distances between the reference patterns RP1, RP2, and RP3 and the shift patterns SP1, SP2, and SP3.

Figure 25:
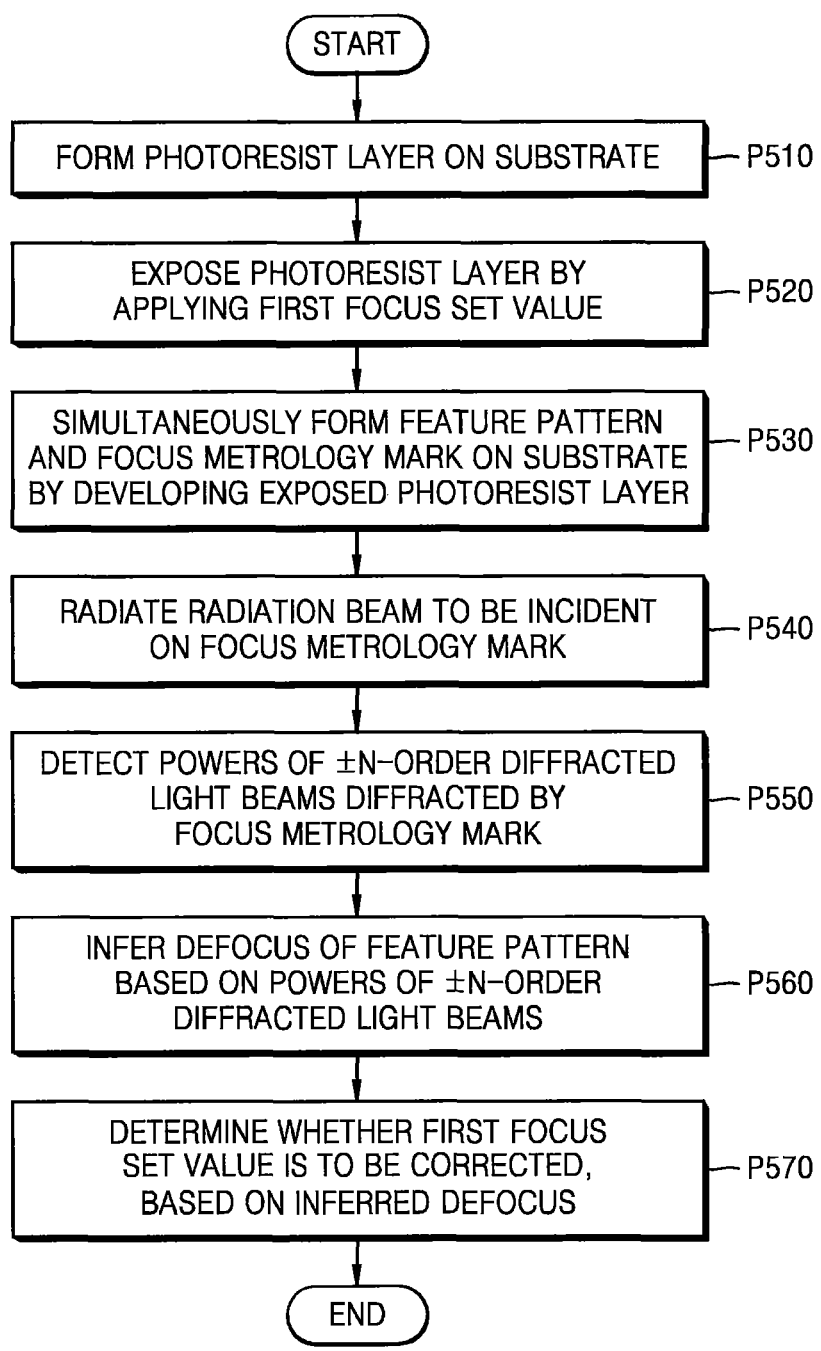
FIG. 25 is a flowchart of a method of manufacturing an integrated circuit (IC) device, according to embodiments of the inventive concepts.

FIG. 25 is a flowchart of a method of manufacturing an IC device, according to embodiments of the inventive concepts.

Referring to FIG. 25, in operation P510, a photoresist layer is formed on a substrate.

The substrate may be a semiconductor wafer. In some embodiments, the substrate may include a semiconductor element, such as silicon (Si) or germanium (Ge), or a compound semiconductor, such as Si carbide (SiC), gallium arsenide (GaAs), indium arsenide (InAs), or indium phosphide (InP). In some embodiments, the substrate may have a silicon-on-insulator (SOI) structure. For example, the substrate may include a buried oxide (BOX) layer. In some embodiments, the substrate may include a conductive region, for example, an impurity-doped well or an impurity-doped structure. The substrate may have various isolation structures, such as, a shallow trench isolation (STI) structure. At least one of an insulation layer, a conductive layer, a semiconductor layer, a metal layer, a metal oxide layer, a metal nitride layer, a polymer layer may be formed on the substrate.

The photoresist layer may be formed of a resist material for EUV (13.5 nm). In other embodiments, the photoresist layer may be formed of resist for F2 excimer laser (157 nm), ArF excimer laser (193 nm), or KrF excimer laser (248 nm). The photoresist layer may be formed of positive photoresist or negative photoresist.

In operation P520, the photoresist layer is exposed by applying a first focus set value.

Although the exposure may be performed using the exposure apparatus 100 of FIG. 7, embodiments of the inventive concepts are not limited thereto. The exposure may be performed using any of a variety of exposure equipment.

In operation P530, a feature pattern and a focus metrology mark are simultaneously formed on the substrate by developing the exposed photoresist layer.

The focus metrology mark is formed on the same level as the level on which the feature pattern is formed on the substrate, and includes a plurality of metrology patterns spaced apart from each other to measure a focal variation of the feature pattern.

For example, the focus metrology mark may be at least one of the focus metrology mark 66 of FIGS. 9A-10 and the focus metrology marks 86A, 86B, 86C, 86D, and 86E of FIGS. 11-15. However, embodiments of the inventive concepts are not limited thereto, and focus metrology marks that are variously modified or changed within the scope of the inventive concepts may be used.

In operation P540, a radiation beam is incident on the focus metrology mark. The radiation beam may have a wavelength of 230 to 850 nm.

The operation P540 may be performed according to the same method as that described above with reference to operation P320 of FIGS. 17 and 18.

In operation P550, the powers of ±n-order diffracted light beams (where n is an integer equal to or greater than 1) of a same non-zero diffraction order, i.e., diffracted at identical angles so as to be symmetrical with each other about a zero-order diffracted light beam from among output beams diffracted by the focus metrology mark are detected.

In some embodiments, the powers of the ±n-order diffracted light beams may be detected according to operation P330 described above with reference to of FIGS. 17 and 18.

In operation P560, defocus that the feature pattern has experienced during the exposure process performed in operation S520 is inferred based on the powers of the ±n-order diffracted light beams detected in operation P550.

The defocus may be inferred based on a relative distance between at least one selected from a plurality of reference pattern groups and at least one selected from a plurality of shift pattern groups, for instance, as indicated by the powers of the 1n-order light beams diffracted thereby. The plurality of reference pattern groups and the plurality of shift pattern groups constitute or define each of the focus metrology marks 66, 86A, 86B, 86C, 86D, and 86E (see FIGS. 9A-15).

When the micro-DBO key 76, which is used to measure an overlay error, is further formed on the substrate 62 simultaneously with the focus metrology mark 66 as illustrated in FIG. 10 in operation P530, the powers of ±n-order diffracted light beams (where n is an integer equal to or greater than 1) from among diffracted beams output by the micro-DBO key 76 may be further detected while a focal variation in the feature pattern is being inferred in operation 5560, and an overlay error of the feature pattern may be further inferred from the detected powers of the ±n-order diffracted light beams.

In operation P570, it is determined whether the first focus set value is to be corrected, based on the defocus inferred in operation P560.

Figure 26:
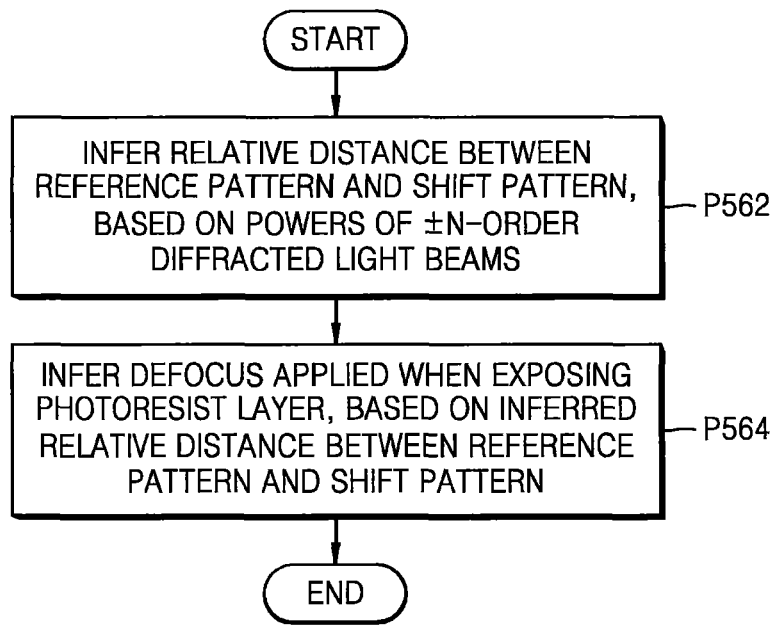
FIG. 26 is a flowchart of an example operation of inferring defocus experienced by a feature pattern during exposure, which is included in a method of manufacturing an IC device according to embodiments of the inventive concepts.

FIG. 26 is a flowchart of an example of the operation P560 of FIG. 25 of inferring the defocus experienced by the feature pattern during exposure.

Referring to FIG. 26, in operation 5562, a relative distance between a reference pattern and a shift pattern of the focus metrology mark is inferred based on the powers of the ±n-order diffracted light beams detected in operation P550 of FIG. 25.

In operation P564, defocus applied in the operation P520 of exposing the photoresist layer is inferred based on the relative distance between the reference pattern and the shift pattern inferred in operation P562.

When the defocus is inferred, results of evaluations performed in similar manners to those described above with reference to FIGS. 19A-24 may be used.

Figure 27:
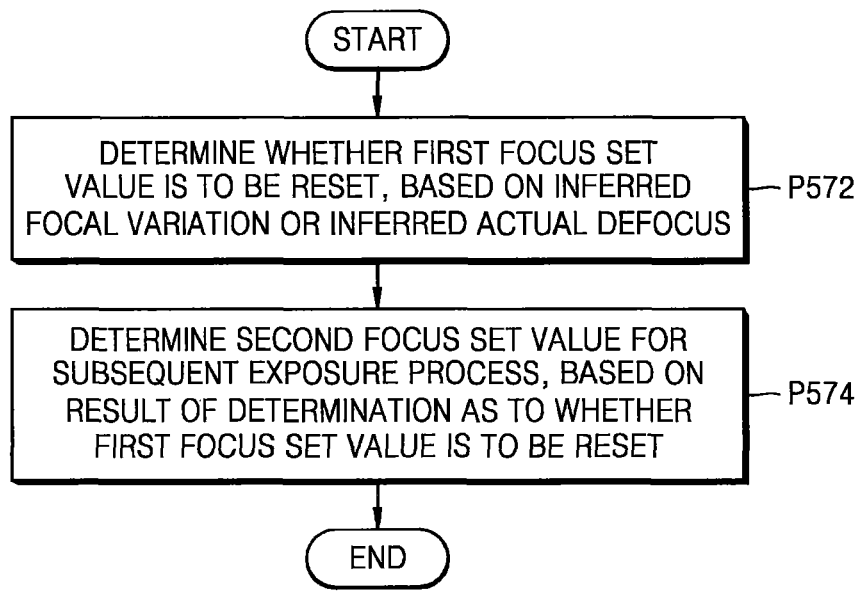
FIG. 27 is a flowchart of an example operation of determining whether a first focus set value is to be corrected, which is included in a method of manufacturing an IC device according to embodiments of the inventive concepts.

FIG. 27 is a flowchart of an example of the operation P570 of FIG. 25 of determining whether the first focus set value is to be corrected.

Referring to FIG. 27, in operation P572, it is determined whether the first focus set value is to be reset, based on the defocus inferred in operation P560 of FIG. 25 or the defocus inferred in operation P564 of FIG. 26.

In operation P574, a second focus set value for a subsequent exposure process is determined based on a result of the determination of operation P572.

If the defocus inferred in operation P560 of FIG. 25 or the defocus inferred in operation P564 of FIG. 26 is within a tolerance value, a focus set value in the subsequent exposure process may not be changed, that is, may be maintained. On the other hand, if the defocus inferred in operation P560 of FIG. 25 or the defocus inferred in operation P564 of FIG. 26 is outside of the tolerance value, the second focus set value may be set to a new value capable of compensate for the defocus inferred in operation P560 of FIG. 25 or the defocus inferred in operation P564 of FIG. 26.

In the method of manufacturing an IC device according to embodiments of the inventive concepts described above with reference to FIGS. 25-27, when monitoring focal variations that a photoresist pattern obtained on a substrate via an exposure process and a developing process has experienced during the exposure process, diffracted light output by a focus metrology mark may be analyzed using the fact that a relative distance between a reference pattern and a shift pattern of the focus metrology mark varies according to defocus of an exposure apparatus. Thus, the focal variations experienced by the photoresist pattern formed on the substrate during the exposure process may be inferred accurately. Focal variations of several nm may be inferred. Therefore, a focus of an exposure apparatus applied during lithography for manufacturing an IC device and fine focal variations experienced during lithography may be in-line monitored in a non-destructive manner.

Moreover, in a process of manufacturing an IC device, focal variations in a plurality of feature patterns formed on the same level as the level on which the focus metrology mark is formed may be measured using ±n-order diffracted light beams from among output beams diffracted by a plurality of diffraction patterns obtained via exposure and development, and overlay errors of the plurality of feature patterns may also be measured using ±n-order diffracted light beams from among output beams diffracted by a micro-DBO key that is formed adjacent to the focus metrology mark. Accordingly, focal variations and overlay errors may be simultaneously in-line monitored using a single substrate target in an actual product manufacturing process, leading to a reduction in metrology time. Therefore, the productivity of the method of manufacturing an IC device may improve.

Figure 28:
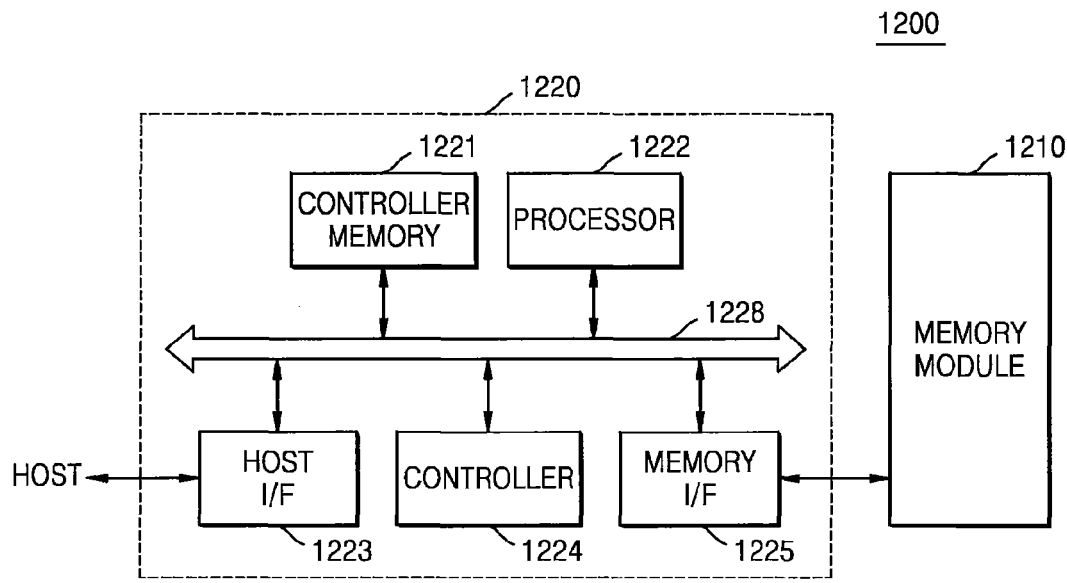
FIG. 28 is a block diagram of a memory card including an IC device fabricated using an IC device fabricating method according to embodiments of the inventive concepts.

FIG. 28 is a block diagram of a memory card 1200 including one or more IC devices fabricated using an IC device fabricating method according to embodiments of the inventive concepts.

The memory card 1200 includes a memory controller 1220 that generates command and address signals and a memory module 1210, for example, a flash memory including one or a plurality of flash memory devices. The memory controller 1220 includes a host interface (I/F) 1223 that transmits or receives command and address signals to or from a host, and a memory I/F 1225 that transmits or receives command and address signals to or from the memory module 1210. The host I/F 1223, a controller 1224, and the memory I/F 1225 communicate with a controller memory 1221, such as a SRAM, and a processor 1222, such as a central processing unit (CPU), through a common bus 1228.

The memory module 1210 receives command and address signals from the memory controller 1220, stores data in at least one of the memory devices of the memory module 1210 in response to the command and address signals, and retrieves data from at least one of the memory devices. Each memory device includes a plurality of addressable memory cells and a decoder that generates column signals and row signals to access at least one of the plurality of addressable memory cells during program and read operations.

At least one of the memory controller 1220 and the memory module 1210 included in the memory card 1200 and the electronic devices 1221, 1222, 1223, 1224 and 1225 included in the memory controller 1220 includes an IC device formed from a substrate target according to embodiments of the inventive concepts, an IC device manufactured using a lithography metrology method according to embodiments of the inventive concepts, and/or an IC device manufactured using an IC device manufacturing method according to embodiments of the inventive concepts.

Figure 29:
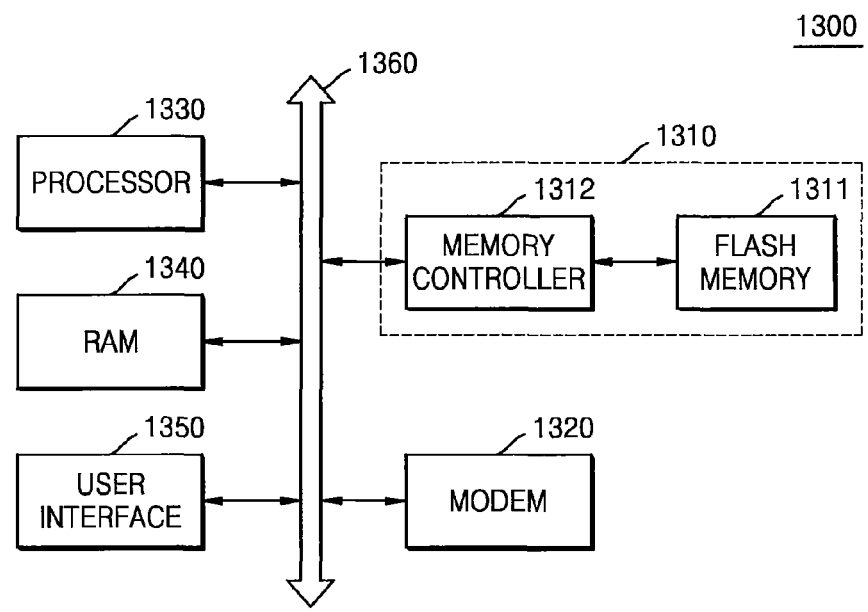
FIG. 29 is a block diagram of a memory system that employs a memory card including an IC device fabricated using an IC device fabricating method according to embodiments of the inventive concepts.

FIG. 29 is a block diagram of a memory system 1300 including a memory card 1310 including one or more IC devices fabricated using an IC device fabricating method according to embodiments of the inventive concepts.

The memory system 1300 may include a processor 1330, such as a CPU, a random access memory (RAM) 1340, a user interface 1350, and a modem 1320 that communicate with each other through a common bus 1360. Each of the components transmits a signal to the memory card 1310 and receives a signal from the memory card 1310 through the common bus 1360. At least one of the memory card 1310, the processor 1330, the RAM 1340, the user interface 1350, and the modem 1320 included in the memory system 1300 includes an IC device formed from a substrate target according to embodiments of the inventive concepts, an IC device manufactured using a lithography metrology method according to embodiments of the inventive concepts, and/or an IC device manufactured using an IC device manufacturing method according to embodiments of the inventive concepts.

The memory system 1300 may be applicable to various electronic application fields. For example, the memory system 1300 may be applicable to solid state drives (SSDs), CMOS image sensors (CISs), and/or a computer application chipset.

The memory systems and the devices may be packaged in any of various package forms including, but not limited to, ball grid arrays (BGAs), chip scale packages (CSPs), plastic leaded chip carrier (PLCC), plastic dual in-line package (PDIP), multi chip package (MCP), wafer-level fabricated package (WFP), and/or wafer-level processed stack package (WSP).

While the inventive concepts has been particularly shown and described with reference to example embodiments thereof, it will be understood that various changes in form and details may be made therein without departing from the spirit and scope of the following claims.

What is claimed is:

1. A method of manufacturing an integrated circuit device, comprising:
   forming a feature pattern and a focus metrology mark, the focus metrology mark comprising a plurality of metrology patterns spaced apart from each other to measure a focal variation of the feature pattern, on a same level on a substrate via an exposure process;
   radiating a radiation beam to be incident on the focus metrology mark;
   detecting powers of ±n-order diffracted light beams diffracted at identical angles so as to be symmetrical with each other about a zero-order diffracted light beam from among output beams diffracted by the focus metrology mark, wherein n is an integer equal to or greater than 1; and
   inferring defocus that has been experienced by the substrate during an exposure process, based on comparison of the powers of the ±n-order diffracted light beams.

2. The method of claim 1, wherein
   the plurality of metrology patterns comprise a plurality of reference pattern groups spaced apart from each other at regular intervals in a first direction and a plurality of shift pattern groups that alternate with the plurality of reference pattern groups and are aligned with the plurality of reference pattern groups in the first direction, and
   the inferring of the defocus is based on a relative distance between at least one selected from the plurality of reference pattern groups and at least one selected from the plurality of shift pattern groups in the first direction.

3. The method of claim 1, wherein
   the substrate further comprises a micro-diffraction based overlay (DBO) key which is formed simultaneously with the feature pattern and is formed to be located together with the focus metrology mark within a one-time measurement spot formed by one shot of a radiation beam that is incident on the substrate, and
   the lithography metrology method further comprises:
   detecting powers of ±m-order diffracted light beams diffracted at identical angles so as to be symmetrical with each other about a zero-order diffracted light beam from among output beams diffracted by the micro-DBO key, wherein m is an integer equal to or greater than 1; and determining an overlay error of the feature pattern from a power deviation between the ±m-order diffracted light beams obtained by the detection.

4. The method of claim 3, wherein the determining of the overlay error is performed simultaneously with the inferring of the defocus.

5. A method of manufacturing an integrated circuit device, the method comprising:

forming a photoresist layer on a substrate;

exposing the photoresist layer by applying a first focus set value;

developing the exposed photoresist layer to form a feature pattern on the substrate and simultaneously form a focus metrology mark on a same level as a level on which the feature pattern is formed on the substrate, the focus metrology mark comprising a plurality of metrology patterns spaced apart from each other to measure a focal variation of the feature pattern;

radiating a radiation beam to be incident on the focus metrology mark;

detecting powers of ±n-order diffracted light beams diffracted at identical angles so as to be symmetrical with each other about a zero-order diffracted light beam from among output beams diffracted by the focus metrology mark, wherein n is an integer equal to or greater than 1;

inferring defocus that the substrate has experienced during an exposure process, based on the detected powers of the ±n-order diffracted light beams; and determining whether the first focus set value is to be corrected, based on the inferred defocus.

6. The method of claim 5, wherein the plurality of metrology patterns comprise a plurality of reference pattern groups spaced apart from each other at regular intervals in a first direction and a plurality of shift pattern groups that alternate with the plurality of reference pattern groups and are aligned with the plurality of reference pattern groups in a straight line in the first direction, and the inferring of the defocus is based on a relative distance between at least one selected from the plurality of reference pattern groups and at least one selected from the plurality of shift pattern groups in the first direction.

7. The method of claim 5, further comprising inferring an overlay error of the feature pattern from the detected powers of the ±n-order diffracted light beams diffracted by a micro-diffraction based overlay (DBO) key on the substrate adjacent the focus metrology mark.

8. An integrated circuit (IC) device comprising a plurality of patterns formed according to the method of claim 5.

9. A method of manufacturing an integrated circuit device, comprising:

forming a focus metrology mark comprising reference and shift photoresist patterns adjacent one another on a substrate;

analyzing characteristics of respective light beams having a same non-zero diffraction order as diffracted by the focus metrology mark comprising the reference and shift photoresist patterns adjacent one another on the substrate; and identifying a focal variation in an exposure process that was used to form the reference and shift photoresist patterns of the focus metrology mark based on comparison of the characteristics of the respective light beams having the same non-zero diffraction order.

10. The method of claim 9, wherein identifying the focal variation comprises:

determining a relative distance between the reference and shift photoresist patterns of the focus metrology mark based on the comparison of the characteristics of the respective light beams having the same non-zero diffraction order as diffracted thereby, wherein the relative distance between the reference and shift photoresist patterns of the focus metrology mark is proportional to the focal variation.

11. The method of claim 10, wherein the characteristics comprise respective power levels of the respective light beams having the same non-zero diffraction order diffracted by the focus metrology mark, and wherein a difference between the respective power levels is proportional to the relative distance between the reference and shift photoresist patterns of the focus metrology mark.

12. The method of claim 11, wherein analyzing comprises:

irradiating the focus metrology mark on the substrate with an incident light beam; and measuring the respective power levels of the respective light beams having the same non-zero diffraction order diffracted by the focus metrology mark responsive to the incident light beam, and wherein identifying the focal variation comprises:

determining a defocus experienced by photoresist feature patterns on a same level of the substrate as the focus metrology mark during the exposure process based on the relative distance between the reference and shift photoresist patterns of the focus metrology mark as determined from the difference between the respective power levels.

13. The method of claim 12, wherein the substrate further includes a diffraction-based overlay key thereon adjacent the focus metrology mark and within an area illuminated by the incident light beam, and further comprising:

measuring respective power levels of light beams having a same non-zero diffraction order diffracted by the diffraction-based overlay key responsive to the incident light beam; and determining an overlay error with respect to the photoresist feature patterns based on a difference between the respective power levels of the light beams diffracted by the diffraction-based overlay key.

14. The method of claim 12, wherein a region of the substrate including the focus metrology mark is free of the photoresist feature patterns.

15. The method of claim 11, further comprising:

providing a photomask comprising a main pattern region and focus metrology mark region, the focus metrology mark region comprising a reference section that does not substantially affect a phase of light passing therethrough and an adjacent phase shift section that is configured to alter a phase of light passing therethrough; and exposing a photoresist layer on the substrate using the photomask comprising the focus metrology mark region having the reference and phase shift sections to define the focus metrology mark comprising the reference and shift photoresist patterns, respectively.

16. The method of claim 15, wherein a width of a light-transmissive region of the reference section is greater than a width of a light-transmissive region of the phase shift section adjacent thereto.

17. The method of claim 16, wherein a ratio of the width of the light-transmissive region of the reference section to the width of the light-transmissive region of the phase shift section corresponds to a range over which the difference between the respective power levels of the respective light beams is linearly proportional to the relative distance between the reference and shift photoresist patterns of the focus metrology mark.

18. The method of claim 16, wherein the reference and phase shift sections of the photomask comprise portions of a same transmissive substrate, and wherein respective thicknesses of the transmissive substrate in the light-transmissive regions of the reference and phase shift sections differ.

19. The method of claim 9, further comprising:
- correcting a set of focal values used in the exposure process responsive to identifying the focal variation; and
- manufacturing the integrated circuit device.

20. The method of claim 19, wherein the focal variation comprises a defocus experienced by the substrate during the exposure process, and wherein correcting the set of focal values comprises:
- determining that the defocus is outside of a depth of focus (DOF) tolerance value;
- calculating compensated focus data based on the defocus responsive to the determining; and
- updating the set of focal values with the compensated focus data.

* * * * *